(12) United States Patent
Manohararajah

(10) Patent No.: US 8,847,624 B1
(45) Date of Patent: Sep. 30, 2014

(54) METHOD AND SYSTEM FOR OPERATING A CIRCUIT

(75) Inventor: Valavan Manohararajah, Scarborough (CA)

(73) Assignee: Altera Corporation, San Jose, CA (US)

( * ) Notice: Subject to any disclaimer, the term of this patent is extended or adjusted under 35 U.S.C. 154(b) by 183 days.

(21) Appl. No.: 13/358,449

(22) Filed: Jan. 25, 2012

(51) Int. Cl.
*H03K 19/173* (2006.01)
*H03K 19/177* (2006.01)

(52) U.S. Cl.
USPC .............................................. 326/38; 326/47

(58) Field of Classification Search
USPC ..................... 326/59, 104, 101, 37, 38, 41, 47
See application file for complete search history.

(56) References Cited

U.S. PATENT DOCUMENTS

| | | | |
|---|---|---|---|
| 6,778,599 B1 | 8/2004 | Doron | |
| 7,358,764 B1 * | 4/2008 | Chan et al. | 326/38 |
| 8,581,624 B2 | 11/2013 | Cashman et al. | |
| 2003/0206564 A1 | 11/2003 | Mills et al. | |
| 2005/0030062 A1 * | 2/2005 | Pedersen | 326/40 |
| 2009/0296567 A1 | 12/2009 | Yasrebi et al. | |
| 2010/0046543 A1 | 2/2010 | Parnaby | |

OTHER PUBLICATIONS

Anderson, et al.; "Raising FPGA Logic Density Through Synthesis-Inspired Architecture", IEEE Xplore; 2011; 14 Pages.
Chapman, Ken; "Multiplexer Selection", Feb. 4, 2008, XILINX, 14 pages.
Anderson, et al.; "Area-Efficient FPGA Logic Elements: Architecture and Syntheses" IEEE Xplore; 2011.

* cited by examiner

*Primary Examiner* — Daniel D Chang

(57) ABSTRACT

Operation of a programmable circuit is described. A circuit including a plurality of multiplexers may be used to perform at least one operation on a plurality of signals. The at least one operation may be performed by the multiplexers using a select line coupled to or shared by the multiplexers. Each input of the circuit may couple to a respective output of a plurality of logic elements. As such, the circuit may be used to perform at least one operation on signals supplied from a plurality of logic elements, thereby expanding the functionality of at least one logic element coupled to the circuit and/or increasing the number of logic elements and other resources available for implementing user designs or performing other functions.

19 Claims, 16 Drawing Sheets

600B

| Input A | Input B | Output C (Input A AND Input B) |
|---------|---------|-------------------------------|
| 0 | 0 | 0 |
| 0 | 1 | 0 |
| 1 | 0 | 0 |
| 1 | 1 | 1 |

| Input A | Input B | Output C (Input A OR Input B) |
|---------|---------|-------------------------------|
| 0 | 0 | 0 |
| 0 | 1 | 1 |
| 1 | 0 | 1 |
| 1 | 1 | 1 |

FIGURE 7B

METHOD AND SYSTEM FOR OPERATING A CIRCUIT

BACKGROUND OF THE INVENTION

Conventional field programmable gate arrays (FPGAs) include logic elements that can be configured by a user to implement various designs or functions. The logic elements are typically connected to other logic elements or other components of the conventional FPGA by programmable routing.

Conventional FPGAs can use the logic elements and programmable routing to perform operations such as shifts, gating, signal selection, etc. However, such operations typically require a large number of logic elements and extensive routing resources to perform. Accordingly, by allocating logic elements and other resources to the performance of such operations, conventional FPGAs reduce the available resources that could otherwise be used to implement user designs or perform other functions.

SUMMARY OF THE INVENTION

Accordingly, a need exists for performing operations on signals while increasing the number of available resources. Embodiments of the present invention provide novel solutions to these needs and others as described below.

Embodiments of the present invention are directed to operation of a programmable circuit. More specifically, a circuit including a plurality of multiplexers may be used to perform at least one operation (e.g., a bypass operation, a shift operation, a selection operation, a logical operation, feeding a function, a gating operation, etc.) on a plurality of signals. The at least one operation may be performed by the multiplexers using a select line coupled to or shared by the multiplexers. Each input of the circuit may couple to a respective output of a plurality of logic elements (e.g., of a programmable logic device or PLD such as a field programmable gate array or FPGA). As such, the circuit may be used to perform at least one operation on signals supplied from a plurality of logic elements, thereby expanding the functionality of at least one logic element coupled to the circuit and/or increasing the number of logic elements and other resources available for implementing user designs or performing other functions.

In one embodiment, a method of operating a circuit includes accessing a plurality of signals using a plurality of inputs of the circuit, wherein the plurality of signals is output by a plurality of logic elements, wherein the circuit includes a plurality of outputs and a first plurality of multiplexers, wherein a first input of the plurality of inputs corresponds to a first output of the plurality of outputs, and wherein a second input of the plurality of inputs corresponds to a second output of the plurality of outputs. At least one signal is accessed using a select line coupled to the first plurality of multiplexers. At least one operation is performed, responsive to the accessing the at least one signal, on the plurality of signals using the first plurality of multiplexers, and wherein the performing the at least one operation is operable to expand functionality of the plurality of logic elements.

In another embodiment, a circuit includes a plurality of inputs and a plurality of outputs, wherein a first input of the plurality of inputs corresponds to a first output of the plurality of outputs, and wherein a second input of the plurality of inputs corresponds to a second output of the plurality of outputs. A first plurality of multiplexers is coupled to the plurality of inputs and the plurality of outputs. The circuit also includes a select line coupled to the first plurality of multiplexers and operable to change a respective state associated with each multiplexer of the first plurality of multiplexers, and wherein the first plurality of multiplexers is further operable to perform, responsive to accessing at least one signal using the select line, at least one operation on a plurality of signals accessed using the plurality of inputs, wherein the plurality of signals is output by a plurality of logic elements, and wherein performance of the at least one operation is operable to expand functionality of the plurality of logic elements.

In yet another embodiment, an integrated circuit includes a processor, a memory coupled to the processor, a plurality of logic elements and a circuit coupled to the plurality of logic elements. The circuit includes a plurality of inputs and a plurality of outputs, wherein a first input of the plurality of inputs corresponds to a first output of the plurality of outputs, and wherein a second input of the plurality of inputs corresponds to a second output of the plurality of outputs. A first plurality of multiplexers is coupled to the plurality of inputs and the plurality of outputs. The circuit also includes a select line coupled to the first plurality of multiplexers and operable to change a respective state associated with each multiplexer of the first plurality of multiplexers, and wherein the first plurality of multiplexers is further operable to perform, responsive to accessing at least one signal using the select line, at least one operation on a plurality of signals accessed using the plurality of inputs, wherein the plurality of signals is output by the plurality of logic elements, and wherein performance of the at least one operation is operable to expand functionality of the plurality of logic elements.

BRIEF DESCRIPTION OF THE DRAWINGS

The present invention is illustrated by way of example, and not by way of limitation, in the figures of the accompanying drawings and in which like reference numerals refer to similar elements.

FIG. 6B shows an exemplary truth table associated with at least one first logical operation in accordance with one embodiment of the present invention.

FIG. 7B shows an exemplary truth table associated with at least one second logical operation in accordance with one embodiment of the present invention.

DETAILED DESCRIPTION OF THE INVENTION

Figure 1:
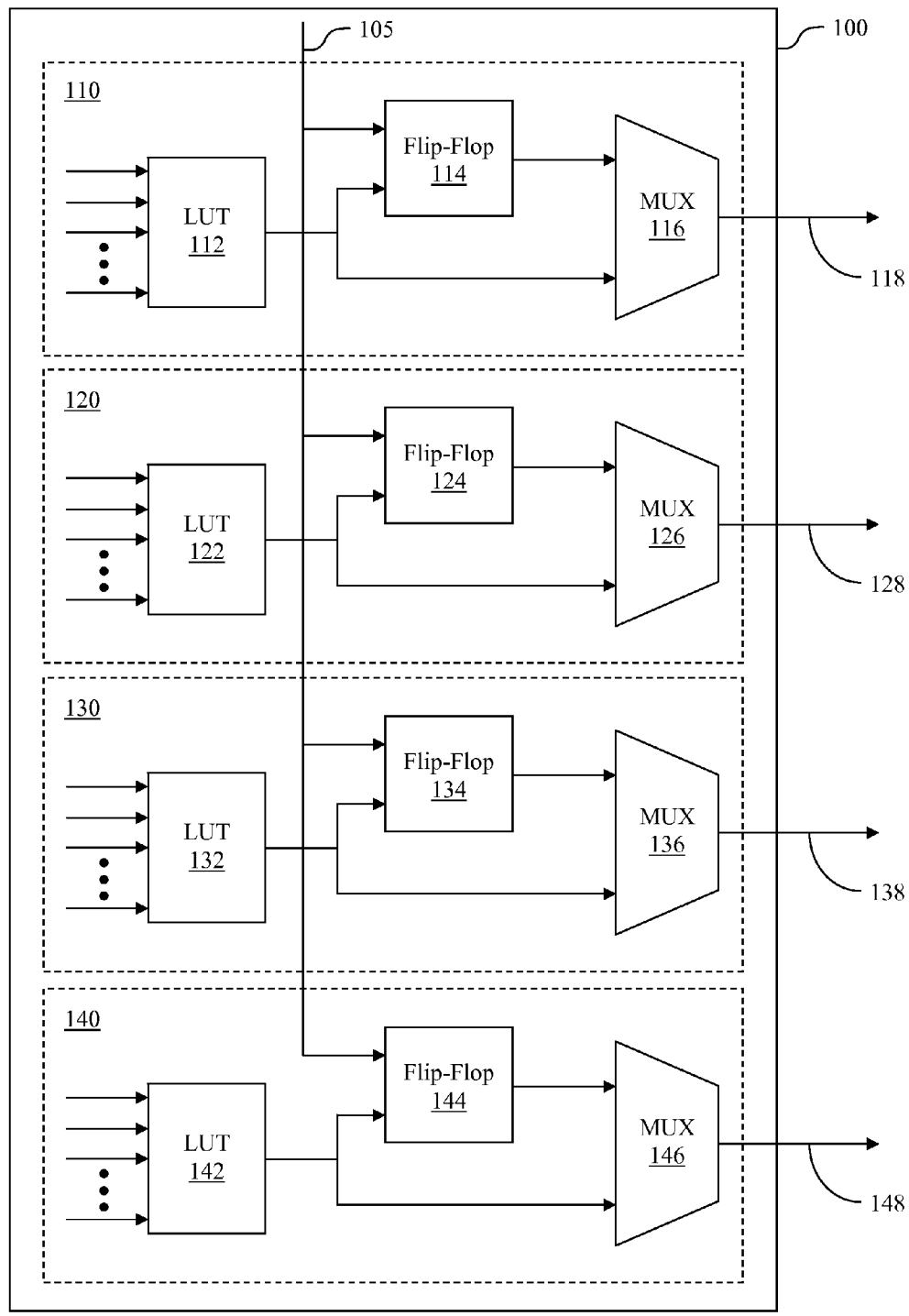
FIG. 1 shows an exemplary logic element cluster in accordance with one embodiment of the present invention.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "accepting," "accessing," "adding," "analyzing," "applying," "assembling," "assigning," "bypassing," "calculating," "capturing," "changing," "collecting," "combining," "communicating," "comparing," "conducting," "configuring," "creating," "defining," "depicting," "detecting," "determining," "displaying," "establishing," "executing," "facilitating," "filtering," "generating," "grouping," "identifying," "incrementing," "initiating," "interacting," "modifying," "monitoring," "moving," "notifying," "outputting," "performing," "placing," "presenting," "processing," "programming," "providing," "querying," "reading," "removing," "repeating," "sampling," "setting," "sorting," "storing," "subtracting," "tracking," "transforming," "using," "writing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the Present Invention

FIG. 1 shows exemplary logic element cluster 100 in accordance with one embodiment of the present invention. As shown in FIG. 1, cluster 100 includes a plurality of logic elements (e.g., 110, 120, 130 and 140). The logic elements may be programmed and/or configured by a user, automatically, some combination thereof, etc. Each logic element includes a respective lookup table or LUT (e.g., 112, 122, 132 and 142), a respective flip-flop (e.g., 114, 124, 134 and 144), and a respective multiplexer or MUX (e.g., 116, 126, 136 and 146). Each MUX may output (e.g., using output 118, output 128, output 138 and output 148, respectively) either a registered version of a LUT output (e.g., from a respective flip-flop) or an unregistered version of a LUT output (e.g., from a respective LUT) based on a respective select signal (not shown) coupled to each MUX.

Figure 2:
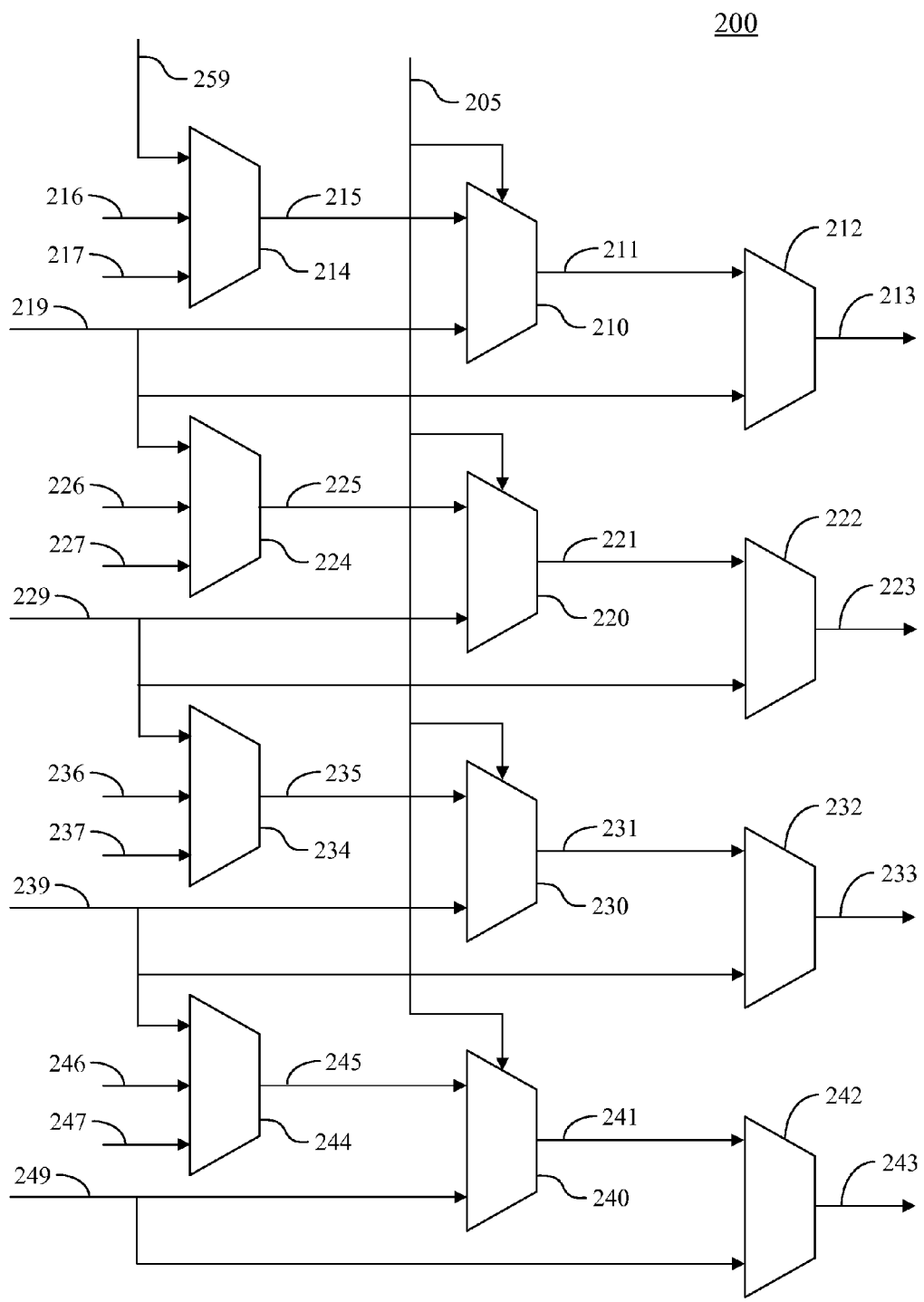
FIG. 2 shows an exemplary circuit for performing at least one operation in accordance with one embodiment of the present invention.

At least one MUX (e.g., 116, 126, 136 and 146) may be configured before runtime or operation of a circuit (e.g., of cluster 100, of circuit 200 of FIG. 2 or another circuit coupled to cluster 100, etc.). The at least one MUX may be configured automatically, by a user, or some combination thereof.

As shown in FIG. 1, each of the flip-flops (e.g., 114, 124, 134 and 144) may be coupled to a shared line 105 in one embodiment. Line 105 may carry control signals such as set signals, reset signals, clock signals, etc. As such, line 105 may be used to configure or control the operation of the flip-flops (e.g., 114, 124, 134 and 144). One or more of the flip-flops may be configured automatically, by a user, or some combination thereof.

Figure 11:
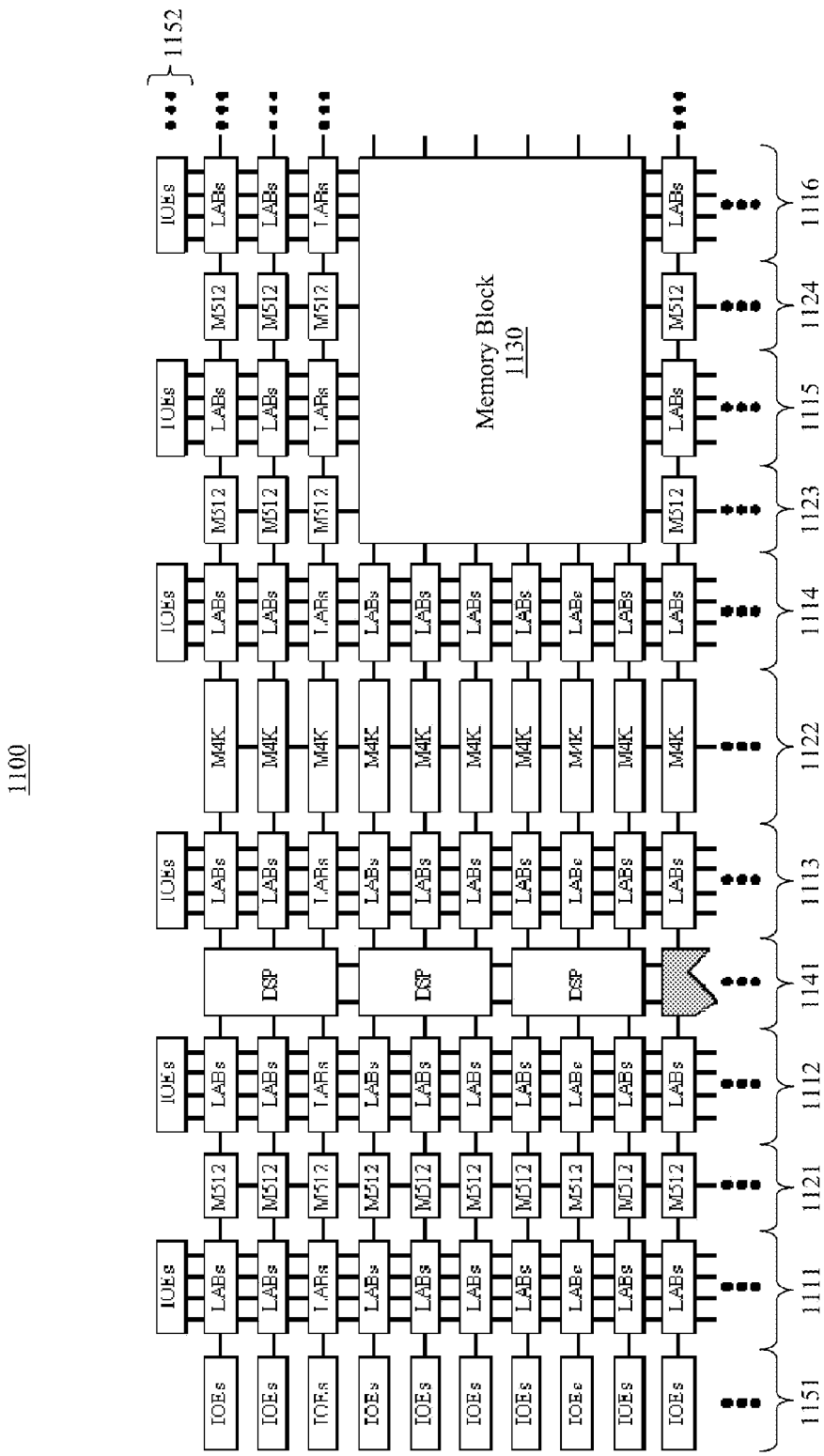
FIG. 11 shows an exemplary programmable logic device (PLD) that can be used to implement one or more components of one or more embodiments of the present invention.

In one embodiment, cluster 100 may be used to implement at least a portion of a logic array block (LAB) of a programmable logic device or PLD (e.g., 1100 of FIG. 11). In one embodiment, cluster 100 may reside in the "fabric" or a portion of a PLD that can be programmed, configured and/or reconfigured by a user. And in one embodiment, one or more components of cluster 100 (e.g., at least one flip-flop, at least one MUX, some combination thereof, etc.) may be programmed and/or configured automatically at or before runtime (e.g., as part of a design created by a user, before performance of an operation or function during runtime, etc.).

Although FIG. 1 shows a specific number of components (e.g., logic elements, LUTs, flip-flops, multiplexers, etc.), it should be appreciated that cluster 100 may include a different number of components in other embodiments. Additionally, although FIG. 1 shows a specific configuration of components, it should be appreciated that the components of cluster 100 may be alternatively configured in other embodiments.

For example, one or more LUTs (e.g., 112, 122, 132, 142, etc.) may have a smaller or larger number of inputs. As another example, one or more multiplexers (e.g., 116, 126, 136, 146, etc.) may have a smaller or larger number of inputs. And as yet another example, one or more of the flip-flops (e.g., 114, 124, 134, 144, etc.) may be coupled to a line (e.g., similar to line 105) that is not shared with any other flip-flops.

FIG. 2 shows exemplary circuit 200 for performing at least one operation in accordance with one embodiment of the present invention. As shown in FIG. 2, circuit 200 includes a first plurality of multiplexers (e.g., 210, 220, 230, 240, etc.), a second plurality of multiplexers (e.g., 212, 222, 232, 242, etc.), and a third plurality of multiplexers (e.g., 214, 224, 234, 244, etc.). The multiplexers (e.g., 210, 220, 230, 240, 212, 222, 232, 242, 214, 224, 234, 244, etc.) or some combination thereof may be coupled to a plurality of inputs (e.g., 219, 229, 239, 249, etc.) of circuit 200 and may be used to perform at least one operation (e.g., a bypass operation, a shift operation, a selection operation, a logical operation, feeding a function, a gating operation, an operation as illustrated in FIG. 3, FIG. 4A, FIG. 4B, FIG. 5A, FIG. 5B, FIG. 6A, FIG. 7A, FIG. 8, FIG. 9, some combination thereof, etc.) on a plurality of signals accessed via the plurality of inputs and/or another input (e.g., select line 205, etc.). In one embodiment, the plurality of signals and/or at least one signal produced as a result of the at least one operation may be output using one or more of a plurality of outputs (e.g., 213, 223, 233, 243, etc.) of circuit 200. Accordingly, performance of the at least one operation by circuit 200 may expand the functionality of at least one logic element (e.g., 110, 120, 130, 140, etc.) and/or increase the number of logic elements and other resources available for implementing user designs or performing other functions.

In one embodiment, each input of circuit 200 may couple to a respective output of cluster 100. For example, input 219 may couple to output 118 to enable signals from output 118 to be received using input 219. As another example, input 229 may couple to output 128 to enable signals from output 128 to be received using input 229. As yet another example, input 239 may couple to output 138 to enable signals from output 138 to be received using input 239. And as a further example, input 249 may couple to output 148 to enable signals from output 148 to be received using input 249.

As shown in FIG. 2, the first plurality of multiplexers (e.g., 210, 220, 230, 240, etc.) may select between an output (e.g., 215, 225, 235, 245, etc.) from the third plurality of multiplexers (e.g., 214, 224, 234, 244, etc.) and the plurality of inputs (e.g., 219, 229, 239, 249, etc.) based on a signal supplied using select line 205. In this manner, the first plurality of multiplexers may be coupled to and/or configured by select line 205, where select line 205 may select at least one input or otherwise determine at least one state of the first plurality of multiplexers. As such, a single signal may be advantageously supplied to and/or used to configure a plurality of multiplexers (e.g., 210, 220, 230, 240, etc.), thereby resulting in a more efficient use of resources.

The second plurality of multiplexers (e.g., 212, 222, 232, 242, etc.) may select between an output (e.g., 211, 221, 231, 241, etc.) from the first plurality of multiplexers (e.g., 210, 220, 230, 240, etc.) and the plurality of inputs (e.g., 219, 229, 239, 249, etc.) based on a signal supplied using at least one select line (not shown). In one embodiment, the second plurality of multiplexers (e.g., 212, 222, 232, 242, etc.) may be coupled to shared select line (e.g., similar to line 205). Alternatively, the second plurality of multiplexers (e.g., 212, 222, 232, 242, etc.) may be coupled to individual select lines (e.g., one select line per MUX, one select line per group of multiplexers, etc.).

As shown in FIG. 2, the third plurality of multiplexers (e.g., 214, 224, 234, 244, etc.) may select between an input to circuit 200 (e.g., input 219, input 229, input 239, input 259, etc.) and two other inputs (e.g., 216, 217, 226, 227, 236, 237, 246, 247, etc.). Input 259 may be an input coupled to an adjacent MUX of the first plurality of multiplexers (e.g., where circuit 200 includes other multiplexers in addition to what is shown in FIG. 2). The third plurality of multiplexers (e.g., 214, 224, 234, 244, etc.) may select between the inputs based on a signal supplied using at least one select line (not shown). In one embodiment, the third plurality of multiplexers (e.g., 214, 224, 234, 244, etc.) may be coupled to shared select line (e.g., similar to line 205). Alternatively, the third plurality of multiplexers (e.g., 214, 224, 234, 244, etc.) may be coupled to individual select lines (e.g., one select line per MUX, one select line per group of multiplexers, etc.).

The other two inputs (e.g., 216, 217, 226, 227, 236, 237, 246, 247, etc.) to the third plurality of multiplexers (e.g., 214, 224, 234, 244, etc.) may be used to supply different types of signals to the third plurality of multiplexers in one embodiment. For example, a first input (e.g., 216, 226, 236, 246, etc.) may be used to supply a low signal (e.g., a digital "0," a ground signal, etc.), whereas a second input (e.g., 217, 227, 237, 247, etc.) may be used to supply a high signal (e.g., a digital "1," a signal with a voltage approximately equal to a power supply coupled to circuit 200, a signal with a voltage above ground, etc.).

As shown in FIG. 2, the first plurality of multiplexers (e.g., 210, 220, 230, 240, etc.) may be dynamically configured and/or controlled to change state (e.g., to select a different input) during runtime or operation of circuit 200 or another circuit (e.g., cluster 100, another circuit coupled to circuit 200, etc.), before runtime or operation of circuit 200 or another circuit (e.g., cluster 100, another circuit coupled to circuit 200, etc.) or after runtime or operation of circuit 200 or another circuit (e.g., cluster 100, another circuit coupled to circuit 200, etc.). In one embodiment, the second plurality of multiplexers (e.g., 212, 222, 232, 242, etc.) and/or the third plurality of multiplexers (e.g., 214, 224, 234, 244, etc.) may be configured and/or controlled to change state (e.g., to select a different input) only before and/or after runtime or operation of circuit 200 or another circuit (e.g., cluster 100, another circuit coupled to circuit 200, etc.). Alternatively, the second plurality of multiplexers (e.g., 212, 222, 232, 242, etc.) and/or the third plurality of multiplexers (e.g., 214, 224, 234, 244, etc.) may be dynamically configured and/or controlled to change state (e.g., to select a different input) during runtime or operation of circuit 200 or another circuit (e.g., cluster 100, another circuit coupled to circuit 200, etc.). Accordingly, by allowing one or more multiplexers of circuit 200 to be advantageously controlled or configured during runtime, embodiments of the present invention provide enhanced capabilities for performance of one or more operations on signals accessed by circuit 200.

Figure 3:
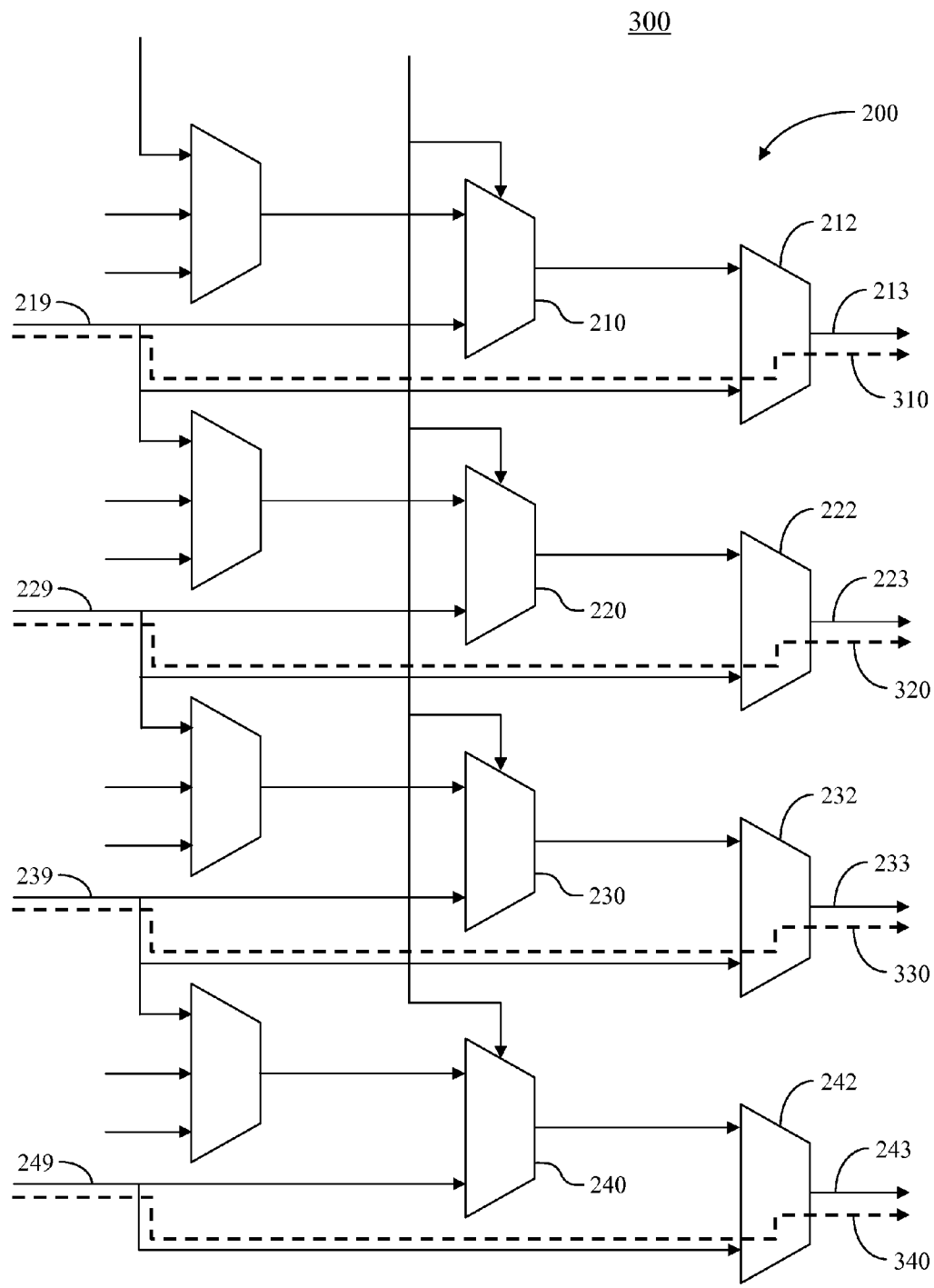
FIG. 3 shows an exemplary diagram depicting signal communication bypassing a plurality of multiplexers in accordance with one embodiment of the present invention.

FIG. 3 shows exemplary diagram 300 depicting signal communication bypassing a plurality of multiplexers in accordance with one embodiment of the present invention. As shown in FIG. 3, each multiplexer of the second plurality of multiplexers (e.g., 212, 222, 232, 242, etc.) may be controlled or configured (e.g., using at least one select line coupled to the second plurality of multiplexers) to access a respective signal from a respective input of circuit 200. For example, multiplexer 212 may be controlled or configured to access a signal communicated to input 219 and output that signal on output 213 as shown in FIG. 3 by dashed line 310. As another example, multiplexer 222 may be controlled or configured to access a signal communicated to input 229 and output that signal on output 223 as shown in FIG. 3 by dashed line 320. As yet another example, multiplexer 232 may be controlled or configured to access a signal communicated to input 239 and output that signal on output 233 as shown in FIG. 3 by dashed line 330. As a further example, multiplexer 242 may be controlled or configured to access a signal communicated to input 249 and output that signal on output 243 as shown in FIG. 3 by dashed line 340. Accordingly, signals may be communicated from a plurality of inputs (e.g., 219, 229, 239, 249, etc.) to a plurality of outputs (e.g., 213, 223, 233, 243, etc.) using the second plurality of multiplexers (e.g., 212, 222, 232, 242, etc.) by bypassing a first plurality of multiplexers (e.g., 210, 220, 230, 240, etc.).

In one embodiment, the second plurality of multiplexers may be configured to perform the bypass operation depicted in FIG. 3 before (e.g., not during) runtime or operation (e.g., of circuit 200, cluster 100, another circuit coupled to circuit 200, etc.). Alternatively, the second plurality of multiplexers may be configured to perform the bypass operation depicted in FIG. 3 during and/or after runtime or operation of circuit 200 or another circuit (e.g., cluster 100, another circuit coupled to circuit 200, etc.).

Figure 4A:
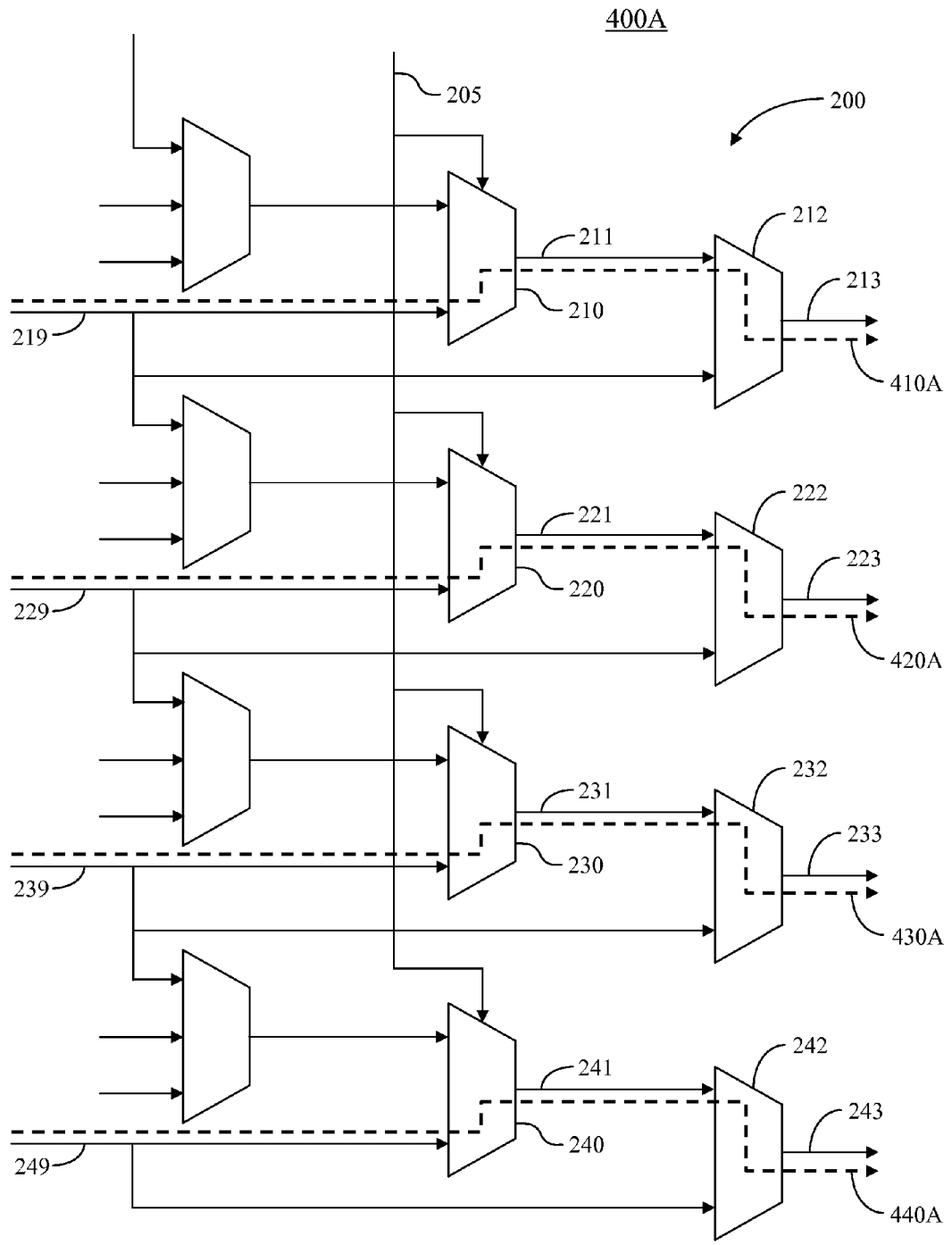
FIG. 4A shows an exemplary diagram depicting signal communication from a plurality of inputs to a plurality of outputs in accordance with one embodiment of the present invention.

FIG. 4A shows exemplary diagram 400A depicting signal communication from a plurality of inputs to a plurality of outputs in accordance with one embodiment of the present invention. As shown in FIG. 4A, each multiplexer of the first plurality of multiplexers (e.g., 210, 220, 230, 240, etc.) may be controlled or configured (e.g., using select line 205) to access a respective signal from a respective input of the plurality of inputs (e.g., 219, 229, 239, 249, etc.). Each multiplexer of the second plurality of multiplexers (e.g., 212, 222, 232, 242, etc.) may be controlled or configured (e.g., using at least one select line coupled to the second plurality of multiplexers) to access a respective signal from a respective output (e.g., 211, 221, 231, 241, etc.) of a respective multiplexer of the first plurality of multiplexers (e.g., 210, 220, 230, 240, etc.). Accordingly, a plurality of signals may be communicated from a plurality of inputs to a plurality of outputs using a first plurality of multiplexers and a second plurality of multiplexers (e.g., as shown in FIG. 4A by dashed lines 410A, 410B, 410C, 410D, etc.).

In one embodiment, the first plurality of multiplexers may be configured to perform the signal communication depicted in FIG. 4A before and/or during runtime or operation of circuit 200 or another circuit (e.g., cluster 100, another circuit coupled to circuit 200, etc.), whereas the second plurality of multiplexers may be configured to perform the signal communication depicted in FIG. 4A before (e.g., not during) runtime or operation (e.g., of circuit 200, cluster 100, another circuit coupled to circuit 200, etc.). Alternatively, the first plurality of multiplexers and/or the second plurality of multiplexers may be configured to perform the signal communication depicted in FIG. 4A at other times (e.g., before runtime or operation of circuit 200 or another circuit, during runtime or operation of circuit 200 or another circuit, after runtime or operation of circuit 200 or another circuit, etc.).

Figure 4B:
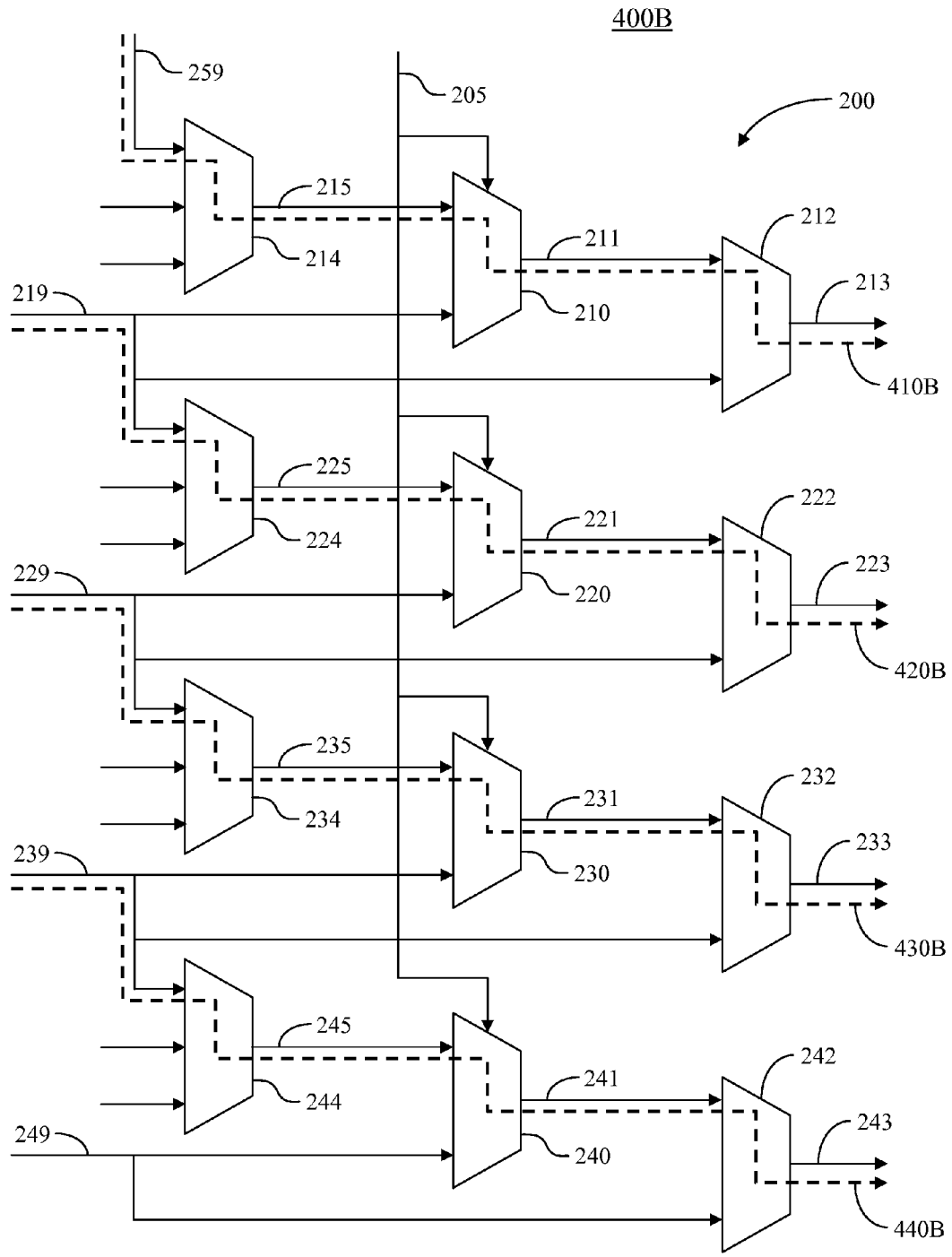
FIG. 4B shows an exemplary diagram depicting a shift operation performed using a plurality of multiplexers in accordance with one embodiment of the present invention.

FIG. 4B shows exemplary diagram 400B depicting a shift operation performed using a plurality of multiplexers in accordance with one embodiment of the present invention. As shown in FIG. 4B, each multiplexer of the third plurality of multiplexers (e.g., 214, 224, 234, 244, etc.) may be controlled or configured (e.g., using at least one select line coupled to the third plurality of multiplexers) to access a respective signal from a respective input of the plurality of inputs (e.g., 219, 229, 239, 259, etc.). Each multiplexer of the first plurality of multiplexers (e.g., 210, 220, 230, 240, etc.) may be controlled or configured (e.g., using select line 205) to access a respective signal from a respective output (e.g., 215, 225, 235, 245, etc.) of a respective multiplexer of the third plurality of multiplexers (e.g., 214, 224, 234, 244, etc.). Each multiplexer of the second plurality of multiplexers (e.g., 212, 222, 232, 242, etc.) may be controlled or configured (e.g., using at least one select line coupled to the second plurality of multiplexers) to access a respective signal from a respective output (e.g., 211, 221, 231, 241, etc.) of a respective multiplexer of the first plurality of multiplexers (e.g., 210, 220, 230, 240, etc.).

Accordingly, the signals accessed at the plurality of inputs are output using the plurality of outputs in a shifted manner (e.g., with a one-bit shift or one-lane shift). For example, the signal accessed from input 219 is output on output 223 as depicted in FIG. 4B by dashed line 420B, thereby shifting the signal by one bit or lane (e.g., compared to the signal communication depicted in FIG. 4A where the signal accessed from input 219 is output on output 213 as depicted by dashed line 410A in FIG. 4A). As another example, the signal accessed from input 229 is output on output 233 as depicted in FIG. 4B by dashed line 430B, thereby shifting the signal by one bit or lane (e.g., compared to the signal communication depicted in FIG. 4A where the signal accessed from input 229 is output on output 223 as depicted by dashed line 420A in FIG. 4A). As yet another example, the signal accessed from input 239 is output on output 243 as depicted in FIG. 4B by dashed line 440B, thereby shifting the signal by one bit or lane (e.g., compared to the signal communication depicted in FIG. 4A where the signal accessed from input 239 is output on output 233 as depicted by dashed line 430A in FIG. 4A).

In one embodiment, circuit 200 may be used to perform a shift operation of two or more bits or lanes. For example, a signal that has been shifted (e.g., as depicted in FIG. 4B) may be communicated back to a corresponding input and further shifted as it is communicated through circuit 200 a second time. For example, the signal accessed at output 223 (e.g., that has already been shifted by one bit or lane) may be communicated back to input 229 and communicated through circuit 200 a second time (e.g., as depicted by dashed line 430B), thereby shifting the signal by two bits or lanes as it is output using output 233. This may be repeated any number of times to increase the shifting of one or more signals.

Communication of signals from an output of circuit 200 to an input of circuit 200 may be performed using one or more components. For example, in a PLD (e.g., 1100 of FIG. 11), programmable routing or other components (e.g., other logic elements, other circuitry, etc.) may be used to direct signals from the outputs of circuit 200 back to the inputs of circuit 200.

In one embodiment, the first plurality of multiplexers may be configured to perform the signal communication depicted in FIG. 4B before and/or during runtime or operation of circuit 200 or another circuit (e.g., cluster 100, another circuit coupled to circuit 200, etc.), whereas the second plurality of multiplexers and/or the third plurality of multiplexers may be configured to perform the signal communication depicted in FIG. 4B before (e.g., not during) runtime or operation (e.g., of circuit 200, cluster 100, another circuit coupled to circuit 200, etc.). Alternatively, one or more of the multiplexers (e.g., at least one multiplexer of the first plurality of multiplexers, at least one multiplexer of the second plurality of multiplexers, at least one multiplexer of the third plurality of multiplexers, some combination thereof, etc.) may be configured to perform the signal communication depicted in FIG. 4A at other times (e.g., before runtime or operation of circuit 200 or another circuit, during runtime or operation of circuit 200 or another circuit, after runtime or operation of circuit 200 or another circuit, etc.).

Figure 5A:
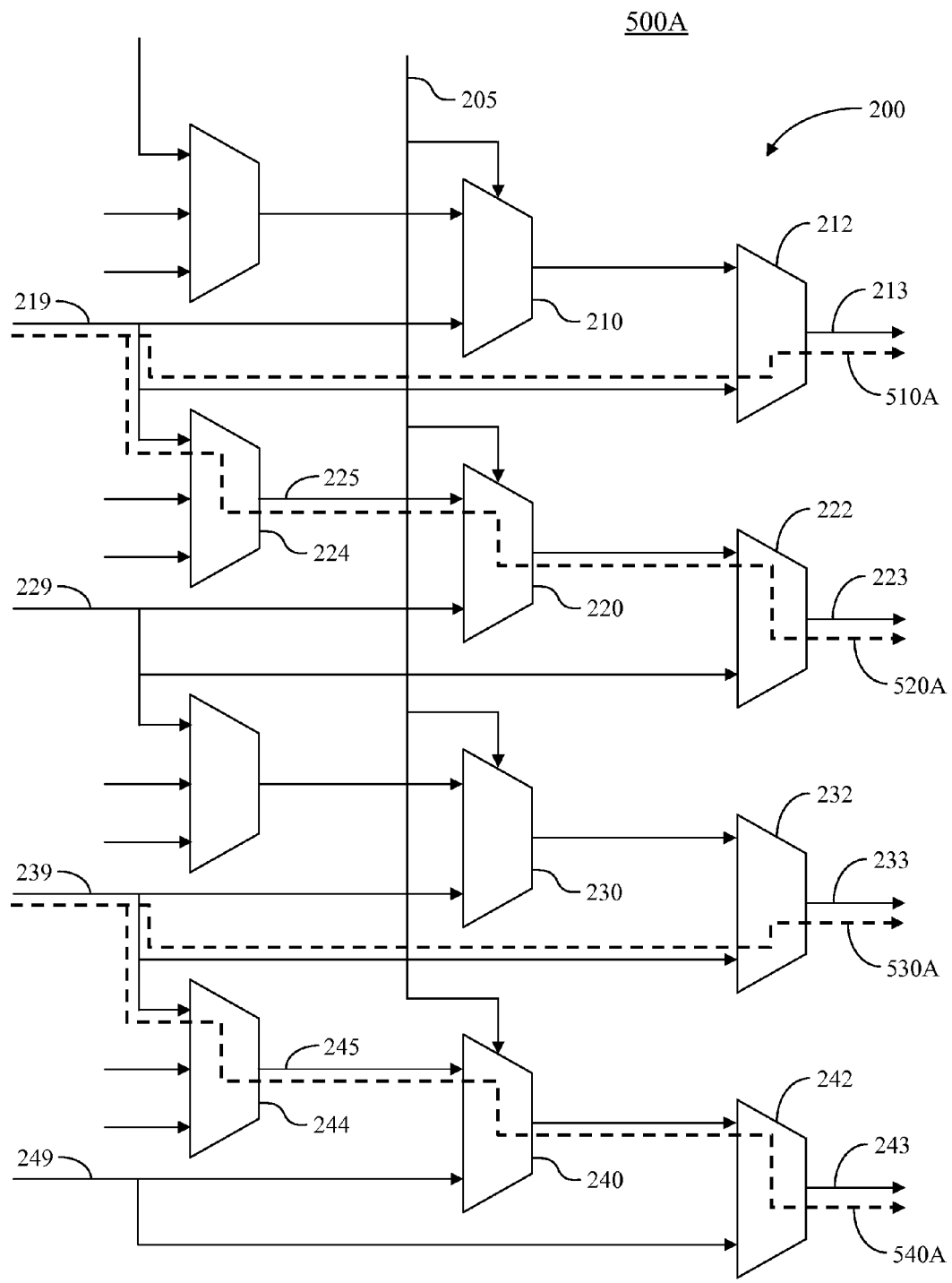
FIG. 5A shows a first exemplary diagram depicting an exemplary selection operation in accordance with one embodiment of the present invention.
Figure 5B:
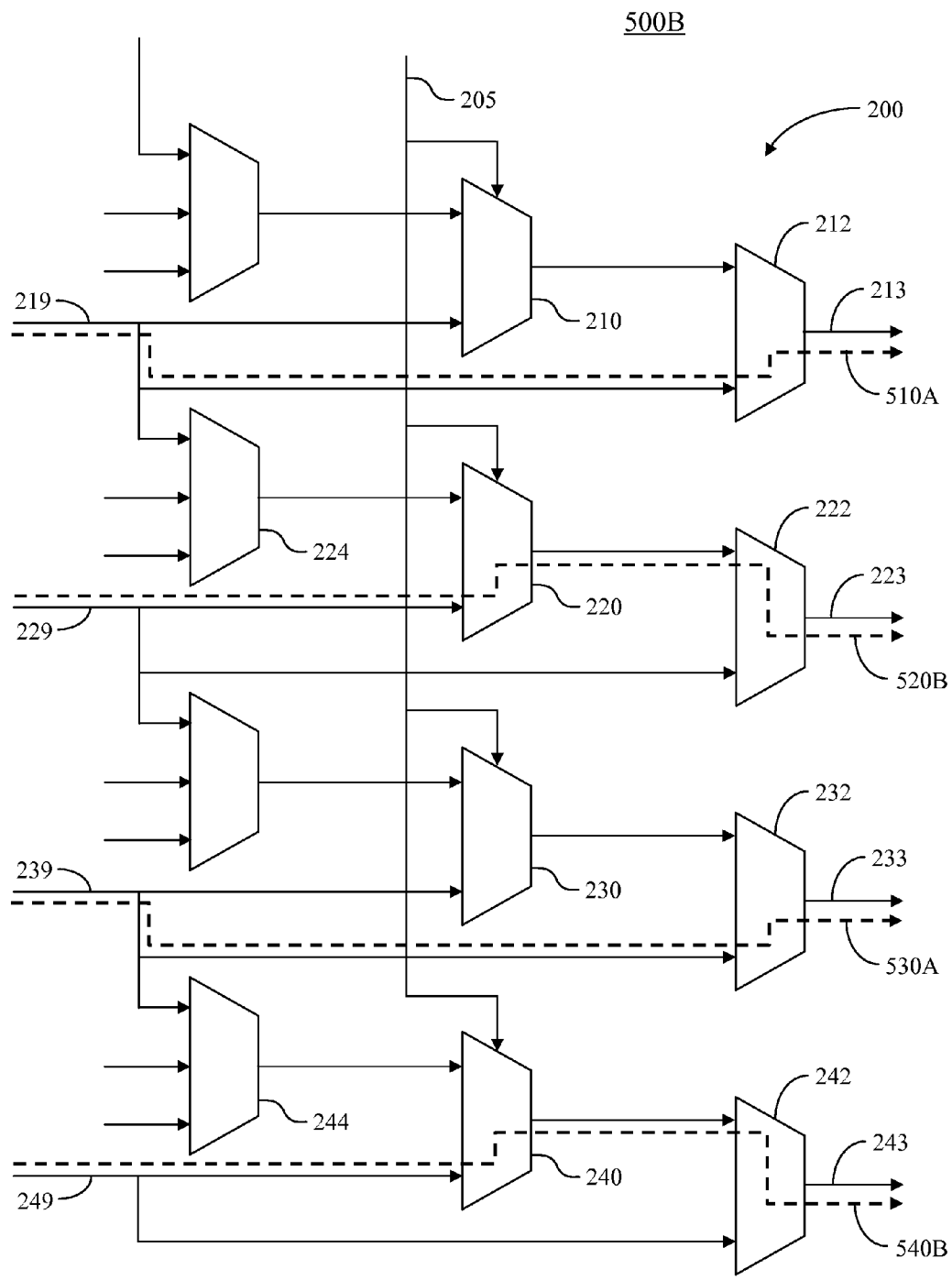
FIG. 5B shows a second exemplary diagram depicting an exemplary selection operation in accordance with one embodiment of the present invention.

FIGS. 5A and 5B show exemplary diagrams 500A and 500B, respectively, depicting an exemplary selection operation in accordance with one embodiment of the present invention. As shown in FIGS. 5A and 5B, the first plurality of multiplexers may be configured and/or controlled to select between adjacent inputs based using select line 205. For example, the signal to be output using output 223 may be selected between the signal on input 219 (e.g., as shown by dashed line 520A in FIG. 5A) and the signal on input 229 (e.g., as shown by dashed line 520B in FIG. 5B). Where multiplexer 220 accesses output 225 from multiplexer 224 (e.g., as depicted by dashed line 520A in FIG. 5A), multiplexer 224 may be configured or controlled to access the signal on input 219 (e.g., as depicted by dashed line 520A in FIG. 5A). As another example, the signal to be output using output 243 may be selected between the signal on input 239 (e.g., as shown by dashed line 540A in FIG. 5A) and the signal on input 249 (e.g., as shown by dashed line 540B in FIG. 5B). Where multiplexer 240 accesses output 245 from multiplexer 244 (e.g., as depicted by dashed line 540A in FIG. 5A), multiplexer 244 may be configured or controlled to access the signal on input 239 (e.g., as depicted by dashed line 540A in FIG. 5A).

In one embodiment, the outputs of circuit 200 may be used to supply signals communicated from selectable inputs (e.g., input 219 or input 229 selected using multiplexer 220, input 239 or input 249 selected using multiplexer 240, etc.) and also to supply signals from corresponding inputs by bypassing corresponding multiplexers of the first plurality of multiplexers. For example, the signal from input 219 may be communicated for output on output 213 (e.g., using multiplexer 212 to bypass multiplexer 210 as depicted by dashed line 510A), and the signal from input 239 may be communicated for output on output 233 (e.g., using multiplexer 232 to bypass multiplexer 230 as depicted by dashed line 530A). In this manner, outputs 213 and 233 may be used to supply signals from corresponding inputs by bypassing corresponding multiplexers of the first plurality of multiplexers, whereas outputs 223 and 243 may be used to supply signals communicated from selectable inputs.

In one embodiment, circuit 200 may allow the contemporaneous output of signals communicated from selectable inputs and signals from corresponding inputs by bypassing corresponding multiplexers of the first plurality of multiplexers (e.g., as depicted in FIGS. 5A and 5B). And in one embodiment, the outputs used to supply signals communicated from selectable inputs (e.g., outputs 223 and 243) may be interlaced with the outputs used to supply signals from corresponding inputs by bypassing corresponding multiplexers of the first plurality of multiplexers (e.g., outputs 213 and 233).

Accordingly, embodiments of the present invention allow selection between signals on adjacent inputs of circuit 200 to be output on one or more outputs of circuit 200 while also providing access (e.g., using one or more other outputs of circuit 200) to one or more input signals regardless of the state or configuration of the first plurality of multiplexers (e.g., 210, 220, 230, 240, etc.). This may be advantageous in situations where it is desired to have access to one or more signals (e.g., at least one clock signal, at least one data signal, at least one power signal, etc.) all the time or regardless of the state or configuration of the first plurality of multiplexers and also to have the ability to select between signals on adjacent inputs of the circuit (e.g., 200).

In one embodiment, the first plurality of multiplexers may be configured to perform the selection operations depicted in FIGS. 5A and 5B before and/or during runtime or operation of circuit 200 or another circuit (e.g., cluster 100, another circuit coupled to circuit 200, etc.), whereas the second plurality of multiplexers and/or the third plurality of multiplexers may be configured to perform the selection operations and bypass operations depicted in FIGS. 5A and 5B before (e.g., not during) runtime or operation (e.g., of circuit 200, cluster 100, another circuit coupled to circuit 200, etc.). Alternatively, one or more of the multiplexers (e.g., at least one multiplexer of the first plurality of multiplexers, at least one multiplexer of the second plurality of multiplexers, at least one multiplexer of the third plurality of multiplexers, some combination thereof, etc.) may be configured to perform the operations depicted in FIGS. 5A and 5B at other times (e.g., before runtime or operation of circuit 200 or another circuit, during runtime or operation of circuit 200 or another circuit, after runtime or operation of circuit 200 or another circuit, etc.).

Figure 6A:
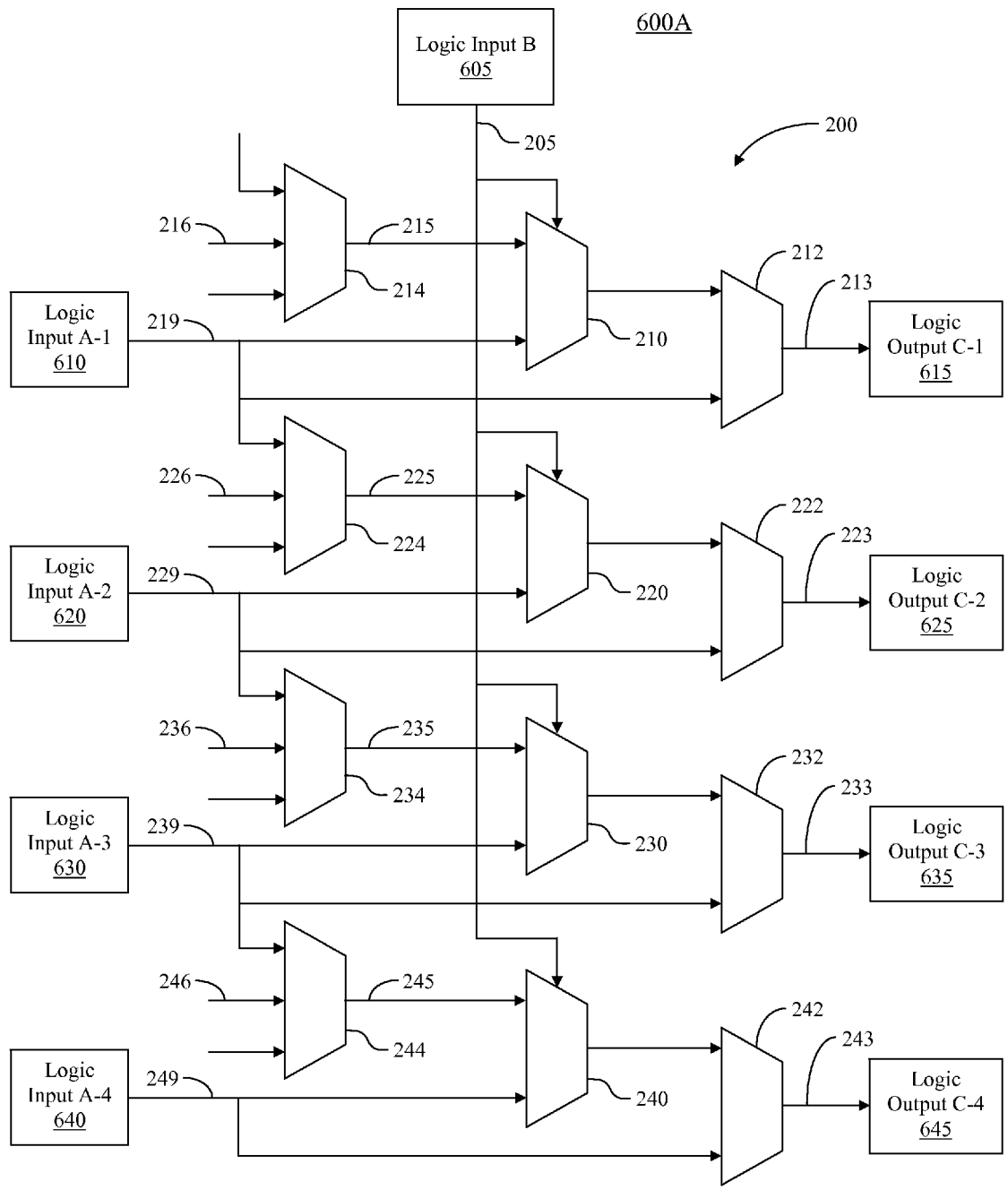
FIG. 6A shows an exemplary diagram depicting at least one first logical operation performed using a plurality of multiplexers in accordance with one embodiment of the present invention.

FIG. 6A shows exemplary diagram 600A depicting at least one first logical operation (e.g., at least one "AND" operation) performed using a plurality of multiplexers in accordance with one embodiment of the present invention. FIG. 6B shows exemplary truth table 600B associated with at least one first logical operation (e.g., at least one "AND" operation) in accordance with one embodiment of the present invention.

As shown in FIG. 6A, circuit 200 may be used to perform at least one first logical operation (e.g., at least one "AND" operation) on a plurality of signals using a plurality of multiplexers. For example, a first AND operation may be performed on a first signal accessed using input 219 (e.g., logic input A-1 610) and a signal accessed using select line 205 (e.g., logic input B 605) using a first set of multiplexers (e.g., 210, 212 and 214), where the result of the first AND operation may be output using output 213 (e.g., logic output C-1 615). As another example, a second AND operation may be performed on a second signal accessed using input 229 (e.g., logic input A-1 620) and a signal accessed using select line 205 (e.g., logic input B 605) using a second set of multiplexers (e.g., 220, 222 and 224), where the result of the second AND operation may be output using output 223 (e.g., logic output C-1 625). As yet another example, a third AND operation may be performed on a third signal accessed using input 239 (e.g., logic input A-1 630) and a signal accessed using select line 205 (e.g., logic input B 605) using a third set of multiplexers (e.g., 230, 232 and 234), where the result of the third AND operation may be output using output 233 (e.g., logic output C-1 635). As a further example, a fourth AND operation may be performed on a fourth signal accessed using input 249 (e.g., logic input A-1 640) and a signal accessed using select line 205 (e.g., logic input B 605) using a fourth set of multiplexers (e.g., 240, 242 and 244), where the result of the fourth AND operation may be output using output 243 (e.g., logic output C-1 645).

In one embodiment, circuit 200 as depicted in FIG. 6A may operate in accordance with truth table 600B if each multiplexer of the third plurality of multiplexers (e.g., 214, 224, 234, 244, etc.) is configured to select or access a respective low signal (e.g., a digital "0," a ground signal, etc.) using a respective input (e.g., 216, 226, 236, 246, etc.). For example, if logic input B 605 is a "0" (e.g., causing selection of the "0" supplied using output 215, 225, 235, 245, etc.), then the logic output (e.g., C-1 615, C-2 625, C-3 635, C-4 645, etc.) may also be "0" (e.g., provided the second plurality of multiplexers is configured or controlled to select respective outputs from each multiplexer of the first plurality of multiplexers) since the inputs (e.g., 216, 226, 236, 246, etc.) to the third plurality of multiplexers (e.g., 214, 224, 234, 244, etc.) are communicated to the outputs (e.g., 213, 223, 233, 243, etc.). This logical functionality is depicted in the first and third rows of truth table 600B (e.g., where input B is "0" causing output C to also be "0").

As another example, if logic input B 605 is a "1" (e.g., causing selection of logic input A-1 610, logic input A-2 620, logic input A-3 630 and logic input A-4 640 supplied using inputs 219, 229, 239 and 249, respectively), then the logic output (e.g., C-1 615, C-2 625, C-3 635, C-4 645, etc.) may be the value of the logic input A (e.g., supplied using inputs 219, 229, 239 and 249) since the logic input A is supplied to the outputs (e.g., 213, 223, 233, 243, etc.) using the first plurality of multiplexers (e.g., 210, 220, 230, 240, etc.) and the second plurality of multiplexers (e.g., 213, 223, 233, 243, etc.). This logical functionality is depicted in the second and fourth rows of truth table 600B (e.g., where input B is "1" causing output C to be the value of input A).

Accordingly, a plurality of logical operations (e.g., "AND" operations as depicted in FIGS. 6A and 6B) may be contemporaneously performed using circuit 200. The plurality of logical operations may be between signals accessed using inputs to circuit 200 (e.g., input 219, input 229, input 239, input 249, etc.) and a select line (e.g., 205) coupled to or shared by a plurality of multiplexers (e.g., 210, 220, 230, 240, etc.) of circuit 200. In this manner, a shared select line (e.g., 205) may be advantageously repurposed to allow performance of a plurality of logical operations. Furthermore, by utilizing circuit 200 to perform the logical operations, other resources (e.g., one or more logic elements where circuit 200 is implemented using a PLD such as PLD 1100 of FIG. 11, one or more portions of programmable routing where circuit 200 is implemented using a PLD such as PLD 1100 of FIG. 11, etc.) may be freed or made available for implementing user designs or performing other functions.

In one embodiment, the logic input B may be supplied to or accessed by the first plurality of multiplexers as shown in FIG. 6A during runtime or operation of circuit 200 or another circuit (e.g., cluster 100, another circuit coupled to circuit 200, etc.), whereas the second plurality of multiplexers and/or the third plurality of multiplexers may be configured as shown in FIG. 6A before (e.g., not during) runtime or operation (e.g., of circuit 200, cluster 100, another circuit coupled to circuit 200, etc.). Alternatively, one or more of the multiplexers (e.g., at least one multiplexer of the first plurality of multiplexers, at least one multiplexer of the second plurality of multiplexers, at least one multiplexer of the third plurality of multiplexers, some combination thereof, etc.) may be configured to perform the at least one logical operation depicted in FIG. 6A at other times (e.g., before runtime or operation of circuit 200 or another circuit, during runtime or operation of circuit 200 or another circuit, after runtime or operation of circuit 200 or another circuit, etc.).

Figure 7A:
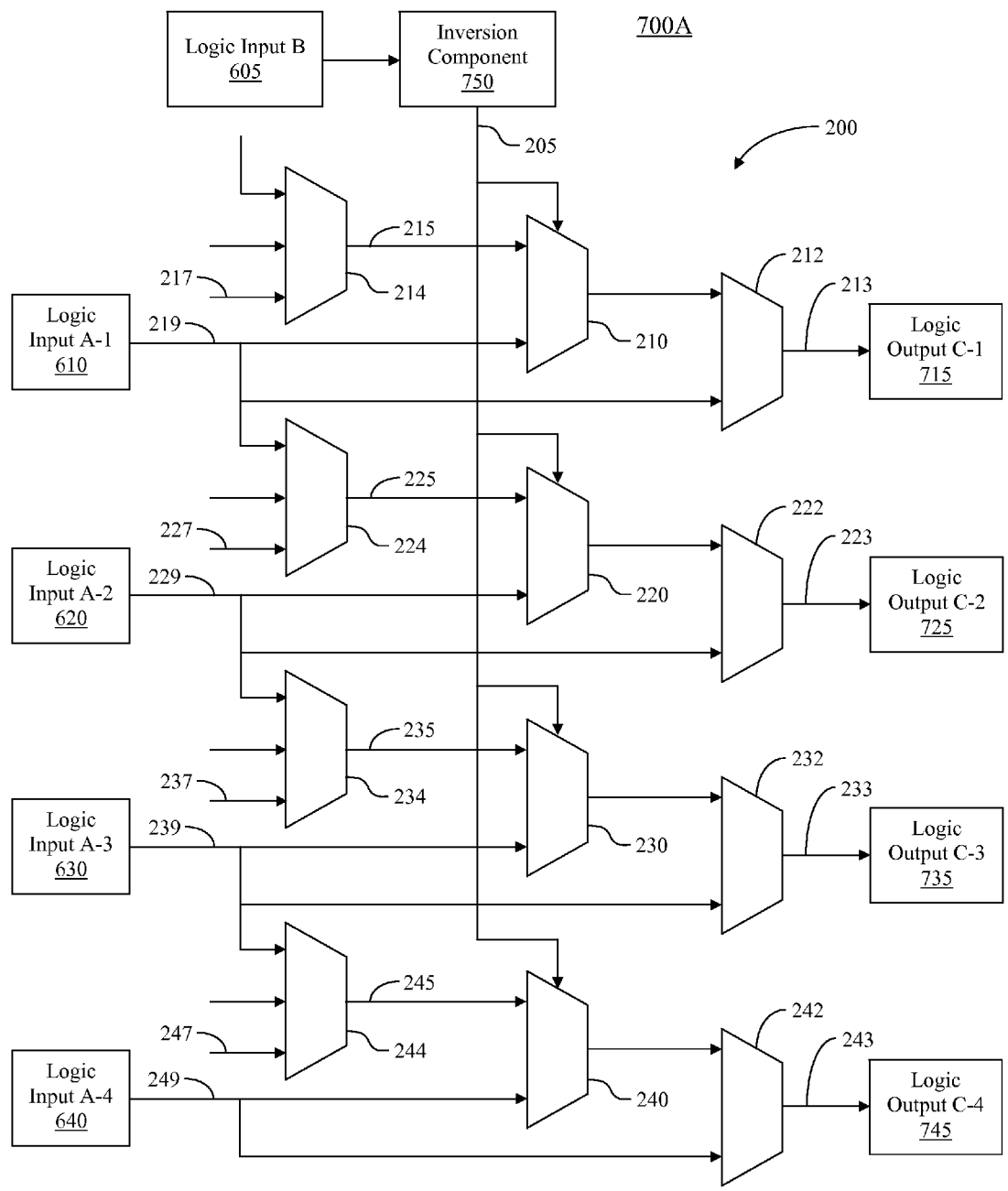
FIG. 7A shows an exemplary diagram depicting at least one second logical operation performed using a plurality of multiplexers in accordance with one embodiment of the present invention.

FIG. 7A shows exemplary diagram 700A depicting at least one second logical operation (e.g., at least one "OR" operation) performed using a plurality of multiplexers in accordance with one embodiment of the present invention. FIG. 7B shows exemplary truth table 700B associated with at least one second logical operation (e.g., at least one "OR" operation) in accordance with one embodiment of the present invention.

As shown in FIG. 7A, circuit 200 may be used to perform at least one second logical operation (e.g., at least one "OR" operation) on a plurality of signals using a plurality of multiplexers. Circuit 200 as depicted in FIG. 7A may operate similarly to circuit 200 as depicted in FIG. 6A, except that logic input B may be inverted (e.g., by inversion component 750). Inversion component 750 may be implemented using at least one LUT, at least one inverter logic gate or any other component capable of inverting a signal. Additionally, each multiplexer of the third plurality of multiplexers may be configured to select or access a respective high signal (e.g., a digital "1," a signal with a voltage approximately equal to a power supply coupled to circuit 200, a signal with a voltage above ground, etc.) using a respective input (e.g., 217, 227, 237, 247, etc.).

For example, a first OR operation may be performed on a first signal accessed using input 219 (e.g., logic input A-1 610) and a signal accessed using select line 205 (e.g., logic input B 605) using a first set of multiplexers (e.g., 210, 212 and 214), where the result of the first OR operation may be output using output 213 (e.g., logic output C-1 715). As another example, a second OR operation may be performed on a second signal accessed using input 229 (e.g., logic input A-1 620) and a signal accessed using select line 205 (e.g., logic input B 605) using a second set of multiplexers (e.g., 220, 222 and 224), where the result of the second OR operation may be output using output 223 (e.g., logic output C-1 725). As yet another example, a third OR operation may be performed on a third signal accessed using input 239 (e.g., logic input A-1 630) and a signal accessed using select line 205 (e.g., logic input B 605) using a third set of multiplexers (e.g., 230, 232 and 234), where the result of the third OR operation may be output using output 233 (e.g., logic output C-1 735). As a further example, a fourth OR operation may be performed on a fourth signal accessed using input 249 (e.g., logic input A-1 640) and a signal accessed using select line 205 (e.g., logic input B 605) using a fourth set of multiplexers (e.g., 240, 242 and 244), where the result of the fourth OR operation may be output using output 243 (e.g., logic output C-1 745).

In one embodiment, circuit 200 as depicted in FIG. 7A may operate in accordance with truth table 700B if logic input B 605 is inverted (e.g., using inversion component 750) and each multiplexer of the third plurality of multiplexers (e.g., 214, 224, 234, 244, etc.) is configured to select or access a respective high signal (e.g., a digital "1," a signal with a voltage approximately equal to a power supply coupled to circuit 200, a signal with a voltage above ground, etc.) using a respective input (e.g., 217, 227, 237, 247, etc.). For example, if logic input B 605 is a "0" (e.g., which is inverted to a "1" by inversion component 750 causing selection of logic input A-1 610, logic input A-2 620, logic input A-3 630 and logic input A-4 640 supplied using inputs 219, 229, 239 and 249, respectively), then the logic output (e.g., C-1 715, C-2 725, C-3 735, C-4 745, etc.) may be the value of the logic input A (e.g., supplied using inputs 219, 229, 239 and 249) since the logic input A is supplied to the outputs (e.g., 213, 223, 233, 243, etc.) using the first plurality of multiplexers (e.g., 210, 220, 230, 240, etc.) and the second plurality of multiplexers (e.g., 213, 223, 233, 243, etc.). This logical functionality is depicted in the first and third rows of truth table 700B (e.g., where input B is "0" causing output C to be the value of input A).

As another example, if logic input B 605 is a "1" (e.g., which is inverted to a "0" by inversion component 750 causing selection of the "1" supplied using output 215, 225, 235, 245, etc.), then the logic output (e.g., C-1 715, C-2 725, C-3 735, C-4 745, etc.) may also be "1" (e.g., provided the second plurality of multiplexers is configured or controlled to select respective outputs from each multiplexer of the first plurality of multiplexers) since the inputs (e.g., 217, 227, 237, 247, etc.) to the third plurality of multiplexers (e.g., 214, 224, 234, 244, etc.) are communicated to the outputs (e.g., 213, 223, 233, 243, etc.). This logical functionality is depicted in the second and fourth rows of truth table 700B (e.g., where input B is "1" causing output C to also be "1").

Accordingly, a plurality of logical operations (e.g., "OR" operations as depicted in FIGS. 7A and 7B) may be contemporaneously performed using circuit 200. The plurality of logical operations may be between signals accessed using inputs to circuit 200 (e.g., input 219, input 229, input 239, input 249, etc.) and a select line (e.g., 205) coupled to or shared by a plurality of multiplexers (e.g., 210, 220, 230, 240, etc.) of circuit 200. In this manner, a shared select line (e.g., 205) may be advantageously repurposed to allow performance of a plurality of logical operations. Furthermore, by utilizing circuit 200 to perform the logical operations, other resources (e.g., one or more logic elements where circuit 200 is implemented using a PLD such as PLD 1100 of FIG. 11, one or more portions of programmable routing where circuit 200 is implemented using a PLD such as PLD 1100 of FIG. 11, etc.) may be freed or made available for implementing user designs or performing other functions.

In one embodiment, the logic input B and/or the inverted version of logic input B (e.g., from inversion component 750) may be supplied to or accessed by the first plurality of multiplexers as shown in FIG. 7A during runtime or operation of circuit 200 or another circuit (e.g., cluster 100, another circuit coupled to circuit 200, etc.), whereas the second plurality of multiplexers and/or the third plurality of multiplexers may be configured as shown in FIG. 7A before (e.g., not during) runtime or operation (e.g., of circuit 200, cluster 100, another circuit coupled to circuit 200, etc.). Alternatively, one or more of the multiplexers (e.g., at least one multiplexer of the first plurality of multiplexers, at least one multiplexer of the second plurality of multiplexers, at least one multiplexer of the third plurality of multiplexers, some combination thereof, etc.) may be configured to perform the at least one logical operation depicted in FIG. 7A at other times (e.g., before runtime or operation of circuit 200 or another circuit, during runtime or operation of circuit 200 or another circuit, after runtime or operation of circuit 200 or another circuit, etc.).

Although FIG. 6A depicts the performance of a specific logical operation (e.g., at least one "AND" operation), it should be appreciated that other logical operations may be performed using circuit 200 (e.g., by reconfiguring one or more of the second plurality of multiplexers, by reconfiguring one or more of the third plurality of multiplexers, etc.). Additionally, although FIG. 7A depicts the performance of a specific logical operation (e.g., at least one "OR" operation), it should be appreciated that other logical operations may be performed using circuit 200 (e.g., by reconfiguring one or more of the second plurality of multiplexers, by reconfiguring one or more of the third plurality of multiplexers, etc.).

Figure 8:
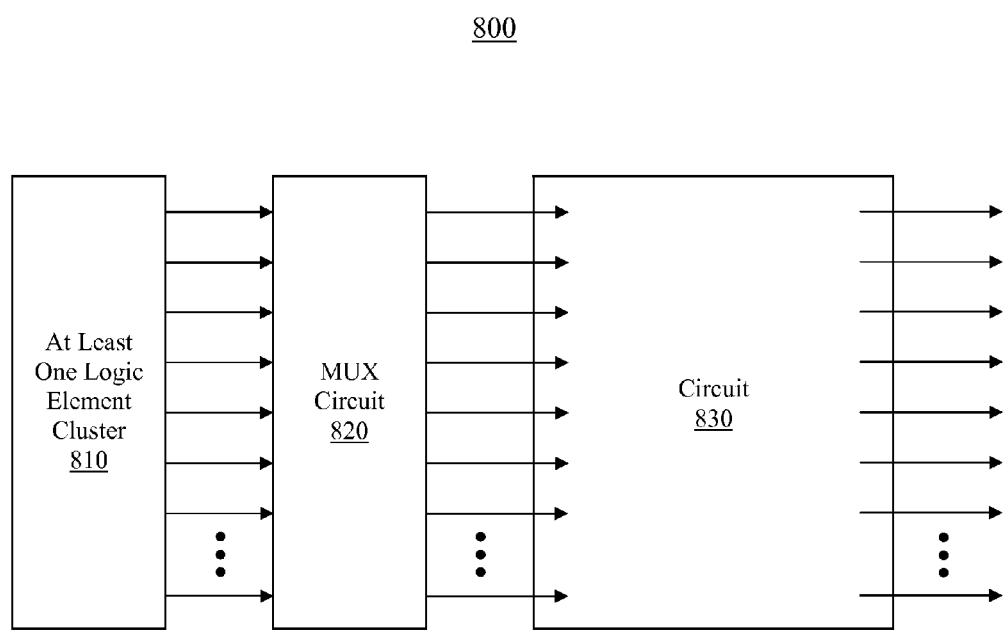
FIG. 8 shows an exemplary system for performing a function in accordance with one embodiment of the present invention.

FIG. 8 shows exemplary system 800 for performing a function in accordance with one embodiment of the present invention. As shown in FIG. 8, at least one logic element cluster 810 may output at least one signal to MUX circuit 820. MUX circuit 820 may output signals to circuit 830, where circuit 830 may be capable of performing a function (e.g., a function of two or more words, a function of a user design implemented using at least in part circuit 830, etc.). In this manner, MUX circuit 820 may be used to "feed" a function implemented by circuit 830. It should be appreciated that MUX circuit 820 may perform one or more operations other than or in addition to feeding a function (e.g., a bypass operation, a shift operation, a selection operation, a logical operation, a gating operation, etc.) in one embodiment.

Cluster 810 may include one or more logic element clusters, where each logic element cluster may be implemented in accordance with cluster 100 of FIG. 1 in one embodiment. MUX circuit 820 may include one or more MUX circuits, where each MUX circuit may be implemented in accordance with circuit 200 (e.g., as discussed with respect to FIG. 2, FIG. 3, FIG. 4A, FIG. 4B, FIG. 5A, FIG. 5B, FIG. 6A, FIG. 7A, or some combination thereof) in one embodiment.

In one embodiment, circuit 830 may include one or more logic elements (e.g., similar to logic elements 110, 120, 130, 140, etc. of FIG. 1) and/or programmable routing which may be configured and/or reconfigured by a user (e.g., based on one or more designs created by a user) during runtime or operation of any component of system 800. In this manner, system 800 may be used to implement at least part of a PLD (e.g., 1100 of FIG. 11).

Although FIG. 8 shows a specific number of components, it should be appreciated that system 800 may include a different number of components in other embodiments. Additionally, although FIG. 8 shows a specific configuration of components, it should be appreciated that the components of system 800 may be alternatively configured in other embodiments.

Figure 9:
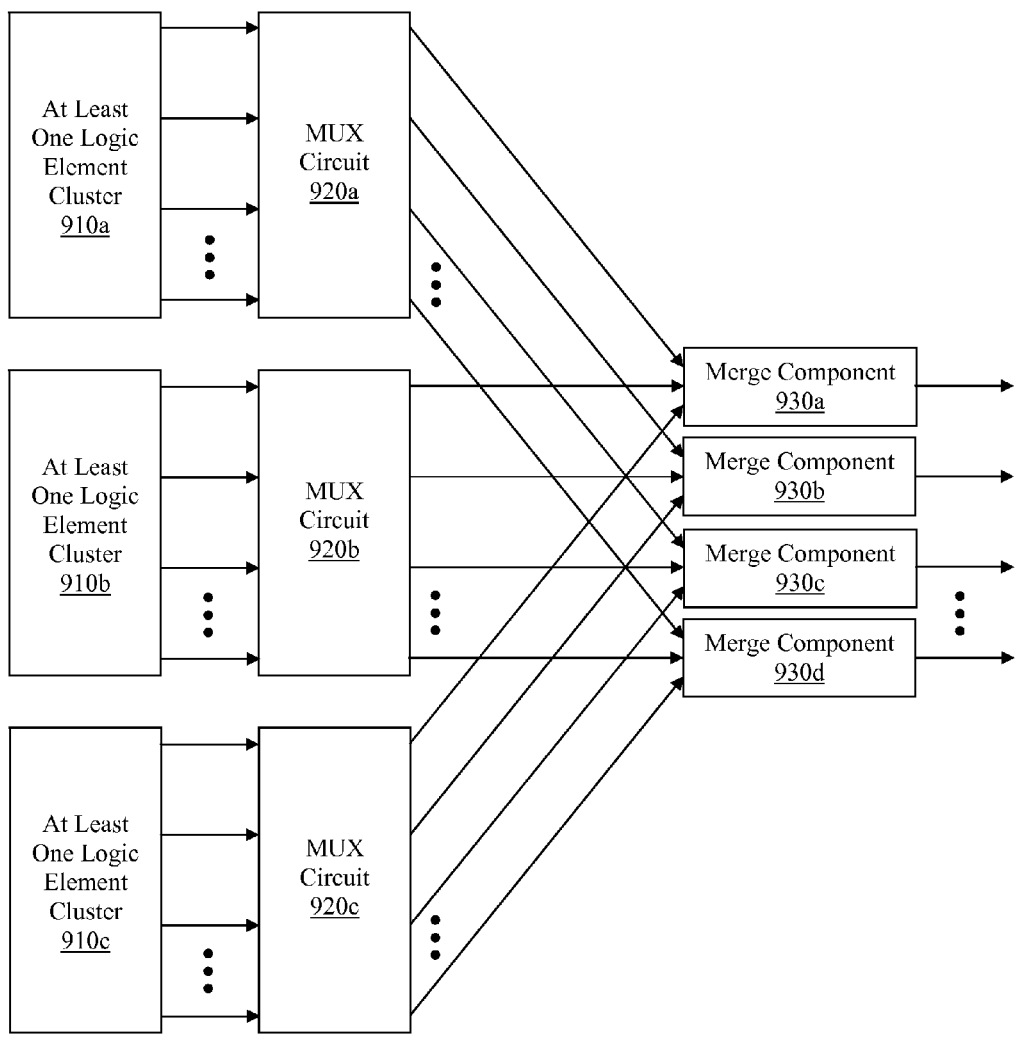
FIG. 9 shows an exemplary system for performing a gating operation in accordance with one embodiment of the present invention.

FIG. 9 shows exemplary system 900 for performing a gating operation in accordance with one embodiment of the present invention. As shown in FIG. 9, at least one logic element cluster (e.g., 910a, 910b, 910c, etc.) may output at least one respective signal to a respective MUX circuit (e.g., 920a, 920b, 920c, etc.). Each MUX circuit (e.g., 920a, 920b, 920c, etc.) may output respective signals to a plurality of merge components (e.g., 930a, 930b, 930c, 930d, etc.). In one embodiment, only one of the MUX circuits may output signals to the merge components (e.g., 930a, 930b, 930c, 930d, etc.) at a time, and therefore, the MUX circuits may be used to perform a gating operation where signals from only one MUX circuit are gated to the outputs (e.g., to the merge components for output therefrom). Alternatively, signals from a plurality of the MUX circuits may be gated to the to the merge circuits (e.g., 930a, 930b, 930c, 930d, etc.) contemporaneously, where the merge circuits may merge or combine the signals from the plurality of MUX circuits for output therefrom.

Each of the at least one logic element clusters (e.g., 910a, 910b, 910c, etc.) may include one or more respective logic element clusters, where each logic element cluster may be implemented in accordance with cluster 100 of FIG. 1 in one embodiment. Each of the MUX circuits (e.g., 920a, 920b, 920c, etc.) may include one or more respective MUX circuits, where each MUX circuit may be implemented in accordance with circuit 200 (e.g., as discussed with respect to FIG. 2, FIG. 3, FIG. 4A, FIG. 4B, FIG. 5A, FIG. 5B, FIG. 6A, FIG. 7A, or some combination thereof) in one embodiment.

Although FIG. 9 shows a specific number of components, it should be appreciated that system 900 may include a different number of components in other embodiments. Additionally, although FIG. 9 shows a specific configuration of components, it should be appreciated that the components of system 900 may be alternatively configured in other embodiments.

Figure 10:
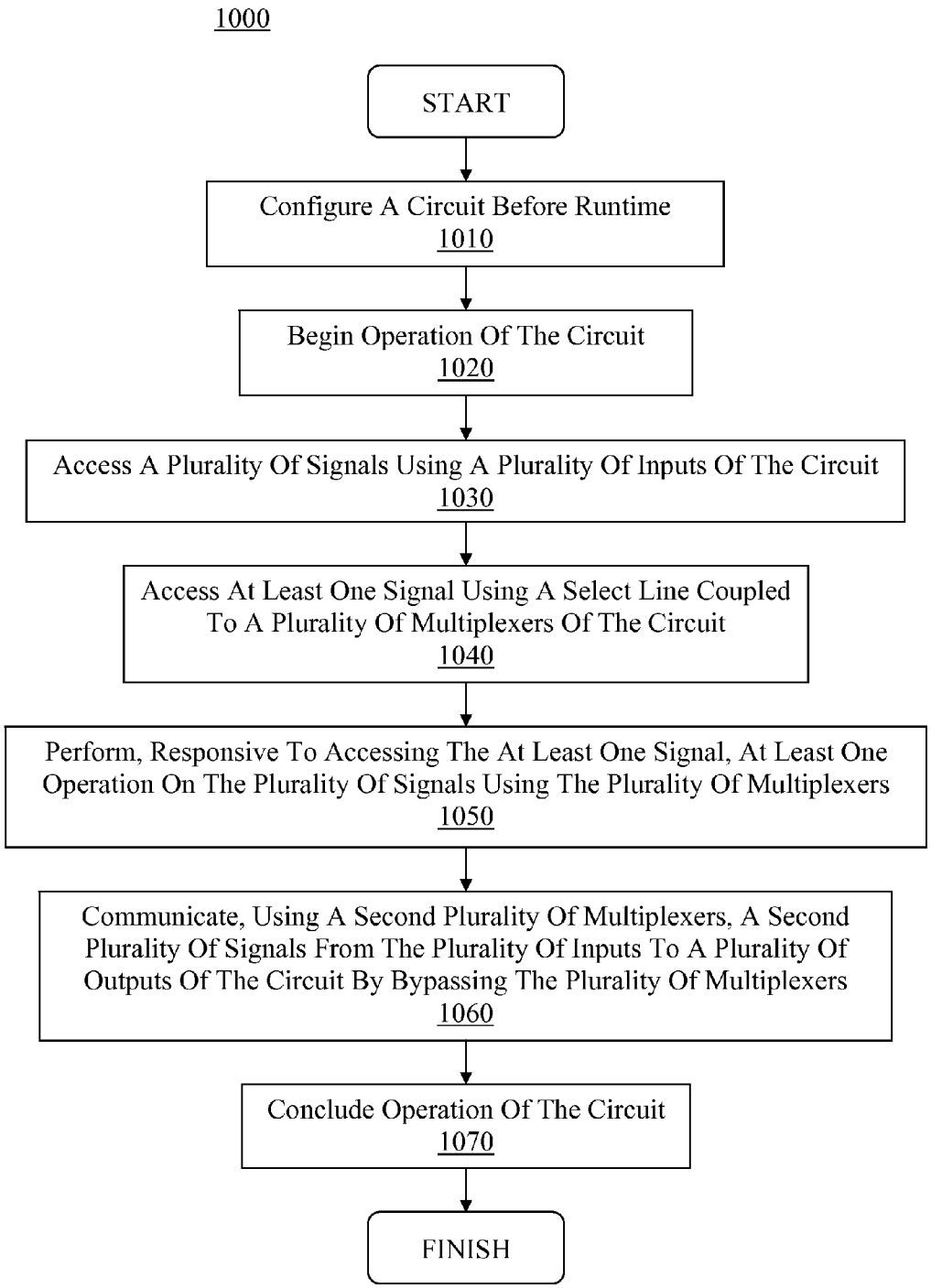
FIG. 10 shows a flowchart of an exemplary process for operating a circuit in accordance with one embodiment of the present invention.

FIG. 10 shows a flowchart of exemplary process 1000 for operating a circuit in accordance with one embodiment of the present invention. As shown in FIG. 10, step 1010 involves configuring a circuit (e.g., 100 of FIG. 1, 200 of FIG. 2, etc.) before runtime. Step 1010 may involve configuring one or more multiplexers (e.g., 210, 220, 230, 240, 212, 222, 232, 242, 214, 224, 234, 244, etc.) of the circuit. A MUX may be configured in step 1010 in any well-known manner, such as by writing configuration data to a configuration register, etc.

In one embodiment, step 1010 may involve configuring one or more parameters associated with a plurality of multiplexers (e.g., 210, 220, 230, 240, etc.) that may be dynamically configured or controlled during runtime. For example, limits for dynamic control during runtime may be set before runtime in step 1010. The limits may include maximum values, minimum values, available inputs to one or multiplexers that may be selected during runtime, available operations (e.g., a bypass operation, a shift operation, a selection operation, a logical operation, a gating operation, etc.) that may be performed by the circuit during runtime, etc.

Step 1020 involves beginning operation of the circuit (e.g., 100, 200, etc.). For example, step 1020 may involve applying a power or clock signal to one or more components of the circuit (e.g., 100, 200, etc.). As another example, step 1020 may involve gating or otherwise supplying at least one signal to one or more inputs (e.g. 219, 229, 239, 249, 205, 105, an input of a LUT, etc.) of the circuit (e.g., 100, 200, etc.).

As shown in FIG. 10, step 1030 involves accessing a plurality of signals using a plurality of inputs of the circuit. For example, signals may be accessed in step 1030 using a plurality of inputs (e.g., 219, 229, 239, 249, etc.) of circuit 200. In one embodiment, the plurality of inputs may include at least two adjacent inputs (e.g., 219 and 229, 229 and 239, 239 and 249, or any other combination of adjacent inputs of circuit 200, etc.).

Step 1040 involves accessing at least one signal using a select line coupled to a plurality of multiplexers of the circuit. For example, step 1040 may involve accessing a signal (e.g., a control signal, a signal associated with a logic input for a logical operation, a signal associated with an inverted logic input for a logical operation, etc.) on a select line (e.g., 205) coupled to a plurality of multiplexers (e.g., 210, 220, 230, 240, etc.) of circuit 200.

As shown in FIG. 10, step 1050 involves performing, responsive to accessing the at least one signal (e.g., accessed in step 1040), at least one operation on the plurality of signals using the plurality of multiplexers (e.g., 210, 220, 230, 240, etc.). The at least one operation may be performed in step 1050 using one or more other multiplexers (e.g., 212, 222, 232, 242, 214, 224, 234, 244, etc.) in combination with the plurality of multiplexers (e.g., 210, 220, 230, 240, etc.) in one embodiment. In one embodiment, the at least one operation may be performed in step 1050 by changing a state (e.g., one or more inputs that are selected for output at any given time) of at least one MUX. And in one embodiment, the at least one operation may include a shift operation (e.g., as described with respect to FIGS. 4A and 4B), a selection operation (e.g., as described with respect to FIGS. 5A and 5B), a logical operation (e.g., as described with respect to FIG. 6A, FIG. 6B, FIG. 7A, FIG. 7B, etc.), feeding a function (e.g., as described with respect to FIG. 8), a gating operation (e.g., as described with respect to FIG. 9), some combination thereof, etc. Accordingly, performance of the at least one operation in step 1050 may expand the functionality of at least one logic element (e.g., 110, 120, 130, 140, etc.) and/or increase the number of logic elements and other resources available for implementing user designs or performing other functions.

Step 1060 involves communicating, using a second plurality of multiplexers (e.g., 212, 222, 232, 242, etc.), a second plurality of signals from the plurality of inputs (e.g., 219, 229, 239, 249, etc.) to a plurality of outputs (e.g., 213, 223, 233, 243, etc.) of the circuit (e.g., 200) by bypassing the plurality of multiplexers (e.g., 210, 220, 230, 240, etc.). In this manner, a bypass operation may be performed using one or more multiplexers (e.g., 212, 222, 232, 242, etc.) of a circuit (e.g., 200).

As shown in FIG. 10, step 1070 may involve concluding operation of the circuit (e.g., 100, 200, etc.). For example, step 1070 may involve removing or gating a power or clock signal from one or more components of the circuit (e.g., 100, 200, etc.). As another example, step 1070 may involve removing or gating at least one signal from one or more inputs (e.g. 219, 229, 239, 249, 205, 105, an input of a LUT, etc.) of the circuit (e.g., 100, 200, etc.).

Programmable Logic Device

FIG. 11 shows exemplary programmable logic device (PLD) 1100 that can be used to implement one or more components of one or more embodiments of the present invention. For instance, PLD 1100 may be used to implement one or more circuits (e.g., 100 of FIG. 1, 200 of FIG. 2, 200 as described with respect to other Figures), system 800, system 900, some combination thereof, etc. In one embodiment, PLD 1100 of FIG. 11 may be used to implement a field programmable gate array (FPGA), a complex programmable logic device (CPLD), a programmable logic arrays (PLA), or some other type of programmable logic device.

As shown in FIG. 11, PLD 1100 may include a plurality of programmable logic array blocks (LABs). The LABs of PLD 1100 may be arranged in rows and/or columns (e.g., as two-dimensional arrays) in one embodiment. For example, columns 1111, 1112, 1113, 1114, 1115 and 1116 may include one or more LABs. In one embodiment, the LABs may be interconnected by a network of column interconnect conductors and/or row interconnect conductors.

Each LAB may include logic that can be configured to implement one or more user-defined logic functions. For example, the interconnect structure of a LAB may be programmed to interconnect the components of the LAB in one or more desired configurations. A LAB may include at least one look-up table (LUT), at least one register, at least one multiplexer, some combination thereof, etc. In one embodiment, the logic may be organized into a plurality of logic elements (LEs), where the interconnection of the LEs can be programmed to vary the functionality of the LAB. And in one embodiment, each LAB may implement or form at least one logic element cluster, where each logic element cluster includes one or more respective LEs.

As shown in FIG. 11, PLD 1100 may include a plurality of memory blocks (e.g., memory block 1130, memory blocks in columns 1121, 1122, 1123, 1124, etc.). In one embodiment, a memory block may include random access memory (RAM), where the RAM may be used to provide multi-port memory, dedicated true dual-port memory, simple dual-port memory, single-port memory, or some combination thereof. And in one embodiment, a memory block may include at least one shift register, at least one first-in-first-out (FIFO) buffer, at least one flip-flop, some combination thereof, etc.

The memory blocks of PLD 1100 may be arranged in rows and/or columns (e.g., as two-dimensional arrays) in one embodiment. For example, columns 1121, 1122, 1123 and 1124 may include one or more memory blocks. Alternatively, one or more memory blocks (e.g., 1130) may be located individually or in small groups (e.g., of two memory blocks, three memory blocks, etc.) in the PLD.

As shown in FIG. 11, PLD 1100 may include a plurality of digital signal processing (DSP) blocks. The DSP blocks may provide digital signal processing functions such as FIR filtering, infinite impulse response (IIR) filtering, image processing, modulation (e.g., equalization, etc.), encryption, error correction, etc. The DSP blocks may offer other functionality such as accumulation, addition/subtraction, summation, etc.

PLD 1100 may include a plurality of input/output elements (IOEs). Each IOE may include at least one input buffer and/or at least one output buffer coupled to one or more pins of the PLD, where the pins may be external terminals separate from the die of the PLD. In one embodiment, an IOE may be used to communicate input signals, output signals, supply voltages, etc. between other components of the PLD and one or more external devices (e.g., separate form the PLD). In one embodiment, the IOEs may be located at end of the rows and columns of the LABs around the periphery of PLD 1100 (e.g., in column 1151, in row 1152, etc.).

In one embodiment, PLD 1100 may include routing resources. For example, PLD 1100 may include LAB local interconnect lines, row interconnect lines (e.g., "H-type wires"), column interconnect lines (e.g., "V-type wires"), etc. that may be used to route signals between components of PLD 1100. The routing resources may be configurable or programmable (e.g., by a user, based on a user design or function, etc.) in one embodiment.

And in one embodiment, PLD 1100 may include or otherwise implement at least one processor and at least one memory. The at least one memory may be a computer-readable medium or computer-usable medium in one embodiment, where the at least one memory may include instructions that when executed by the at least one processor may implement a method of operating a circuit (e.g., in accordance with process 1000 of FIG. 10), etc.

Computer System Platform

Figure 12:
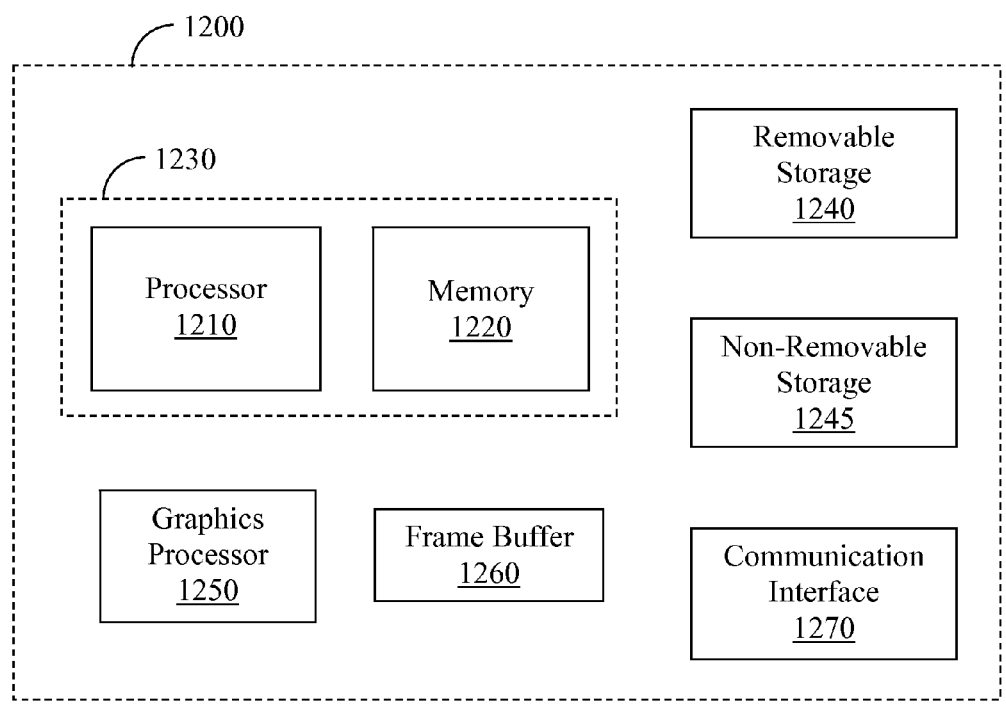
FIG. 12 shows an exemplary computer system platform upon which embodiments of the present invention may be implemented.

FIG. 12 shows exemplary computer system platform 1200 upon which embodiments of the present invention may be implemented. As shown in FIG. 12, portions of the present invention may be implemented by execution of computer-readable instructions or computer-executable instructions that may reside in components of computer system platform 1200 and which may be used as a part of a general purpose computer network. It is appreciated that computer system platform 1200 of FIG. 12 is merely exemplary. As such, the present invention can operate within a number of different systems including, but not limited to, general-purpose computer systems, embedded computer systems, laptop computer systems, hand-held computer systems, portable computer systems, or stand-alone computer systems.

In one embodiment, computer system platform 1200 may be used to implement one or more circuits (e.g., 100 of FIG. 1, 200 of FIG. 2, 200 as described with respect to other Figures), system 800, system 900, some combination thereof, etc. And in one embodiment, one or more components of computer system platform 1200 may be disposed in and/or coupled with a housing or enclosure.

In one embodiment, depicted by dashed lines 1230, computer system platform 1200 may include at least one processor 1210 and at least one memory 1220. Processor 1210 may include a central processing unit (CPU) or other type of processor. Depending on the configuration and/or type of computer system environment, memory 1220 may include volatile memory (e.g., RAM), non-volatile memory (e.g., ROM, flash memory, etc.), or some combination of the two. Additionally, memory 1220 may be removable, non-removable, etc.

In other embodiments, computer system platform 1200 may include additional storage (e.g., removable storage 1240, non-removable storage 1245, etc.). Removable storage 1240 and/or non-removable storage 1245 may include volatile memory, non-volatile memory, or any combination thereof. Additionally, removable storage 1240 and/or non-removable storage 1245 may include CD-ROM, digital versatile disks (DVD) or other optical storage, magnetic cassettes, magnetic tape, magnetic disk storage or other magnetic storage devices, or any other medium which can be used to store information for access by computer system platform 1200.

As shown in FIG. 12, computer system platform 1200 may communicate with other systems, components, or devices via communication interface 1270. Communication interface 1270 may embody computer-readable instructions, data structures, program modules or other data in a modulated data signal (e.g., a carrier wave) or other transport mechanism. By way of example, and not limitation, communication interface 1270 may couple to wired media (e.g., a wired network, direct-wired connection, etc.) and/or wireless media (e.g., a wireless network, a wireless connection utilizing acoustic, radio frequency (RF), infrared, or other wireless signaling, etc.).

Communication interface 1270 may also couple computer system platform 1200 to one or more input devices (e.g., a keyboard, mouse, pen, voice input device, touch input device or touch screen, etc.). In one embodiment, communication interface 1270 may couple computer system platform 1200 to one or more output devices (e.g., a display, speaker, printer, etc.).

As shown in FIG. 12, graphics processor 1250 may perform graphics processing operations on graphical data stored in frame buffer 1260 or another memory (e.g., 1220, 1240, 1245, etc.) of computer system platform 1200. Graphical data stored in frame buffer 1260 may be accessed, processed, and/or modified by components (e.g., graphics processor 1250, processor 1210, etc.) of computer system platform 1200 and/or components of other systems/devices. Additionally, the graphical data may be accessed (e.g., by graphics processor 1250) and displayed on an output device coupled to computer system platform 1200. Accordingly, memory 1220, removable storage 1240, non-removable storage 1245, frame buffer 1260, or a combination thereof, may be a computer-readable medium or computer-usable medium and may include instructions that when executed by a processor (e.g., 1210, 1250, etc.) implement a method of operating a circuit (e.g., in accordance with process 1000 of FIG. 10), etc.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A method of operating a circuit, said method comprising:

accessing a plurality of signals using a plurality of inputs of said circuit, wherein said plurality of signals is output by a plurality of logic elements, wherein said circuit comprises a plurality of outputs and a first plurality of multiplexers, wherein a first input of said plurality of inputs corresponds to a first output of said plurality of outputs, and wherein a second input of said plurality of inputs corresponds to a second output of said plurality of outputs;

accessing at least one signal using a select line coupled to said first plurality of multiplexers; and performing, responsive to said accessing said at least one signal, at least one operation on said plurality of signals using said first plurality of multiplexers, and wherein said performing said at least one operation is operable to expand functionality of said plurality of logic elements, and wherein said at least one operation comprises communicating a first signal from said first input to said second output using a first multiplexer of said first plurality of multiplexers, and wherein said at least one operation further comprises communicating a second signal from said second input to a third output of said plurality of outputs using a second multiplexer of said first plurality of multiplexers.

2. The method of claim 1, wherein said performing further comprises changing, during a runtime of said circuit, a respective state associated with each multiplexer of said first plurality of multiplexers.

3. The method of claim 1, wherein said at least one operation comprises communicating a first signal from said first input to said first output using a first multiplexer of said first plurality of multiplexers, and wherein said at least one operation further comprises communicating a second signal from said second input to said second output using a second multiplexer of said first plurality of multiplexers.

4. The method of claim 1, wherein said performing further comprises communicating said second signal to a third input of said plurality of inputs, and wherein said at least one operation further comprises communicating said second signal from said third input to a fourth output of said plurality of outputs using a third multiplexer of said first plurality of multiplexers.

5. The method of claim 1 further comprising:
configuring, before runtime of said circuit, a second plurality of multiplexers using at least one select line coupled to said second plurality of multiplexers; and
communicating, using said second plurality of multiplexers based on said configuring, a second plurality of signals from said plurality of inputs to said plurality of outputs by bypassing said first plurality of multiplexers.

6. The method of claim 1, wherein said first and second inputs are adjacent inputs, wherein said at least one operation comprises communicating a first signal of said plurality of signals from said first input to said second output using a first multiplexer of said first plurality of multiplexers, and wherein said at least one operation further comprises communicating a second signal of said plurality of signals from said second input to said second output using said first multiplexer.

7. The method of claim 1, wherein said accessing said plurality of signals further comprises accessing a first signal of said plurality of signals using said first input, wherein said operation comprises a logical operation on said first signal and said at least one signal, and wherein said performing further comprises outputting on said first output a second signal associated with a result of said logical operation.

8. A circuit comprising:
a plurality of inputs and a plurality of outputs, wherein a first input of said plurality of inputs corresponds to a first output of said plurality of outputs, and wherein a second input of said plurality of inputs corresponds to a second output of said plurality of outputs;
a first plurality of multiplexers coupled to said plurality of inputs and said plurality of outputs; and
a select line coupled to said first plurality of multiplexers and operable to change a respective state associated with each multiplexer of said first plurality of multiplexers, and
wherein said first plurality of multiplexers is further operable to perform, responsive to accessing at least one signal using said select line, at least one operation on a plurality of signals accessed using said plurality of inputs, wherein said plurality of signals is output by a plurality of logic elements, and wherein performance of said at least one operation is operable to expand functionality of said plurality of logic elements; and
a second plurality of multiplexers coupled to at least one select line other than said select line coupled to said first plurality of multiplexers, wherein said second plurality of multiplexers is operable to communicate, responsive to configuration using said at least one select line, a second plurality of signals from said plurality of inputs to said plurality of outputs by bypassing said first plurality of multiplexers.

9. The circuit of claim 8, wherein said at least one operation comprises communicating a first signal from said first input to said first output using a first multiplexer of said first plurality of multiplexers, and wherein said at least one operation further comprises communicating a second signal from said second input to said second output using a second multiplexer of said first plurality of multiplexers.

10. The circuit of claim 8, wherein said at least one operation comprises communicating a first signal from said first input to said second output using a first multiplexer of said first plurality of multiplexers, and wherein said at least one operation further comprises communicating a second signal from said second input to a third output of said plurality of outputs using a second multiplexer of said first plurality of multiplexers.

11. The circuit of claim 10, wherein said second signal is communicated to a third input of said plurality of inputs, and wherein said at least one operation further comprises communicating said second signal from said third input to a fourth output of said plurality of outputs using a third multiplexer of said first plurality of multiplexers.

12. The circuit of claim 8, wherein said first and second inputs are adjacent inputs, wherein said at least one operation comprises communicating a first signal of said plurality of signals from said first input to said second output using a first multiplexer of said first plurality of multiplexers, and wherein said at least one operation further comprises communicating a second signal of said plurality of signals from said second input to said second output using said first multiplexer.

13. The circuit of claim 8, wherein a first multiplexer of said first plurality of multiplexers is operable to access a first signal of said plurality of signals using said first input, wherein said operation comprises a logical operation on said first signal and said at least one signal, and wherein said first multiplexer is further operable to output on said first output a second signal associated with a result of said logical operation.

14. An integrated circuit comprising:
a processor;
a memory coupled to said processor;
a plurality of logic elements; and
a circuit coupled to said plurality of logic elements, said circuit comprising:
a plurality of inputs and a plurality of outputs, wherein a first input of said plurality of inputs corresponds to a first output of said plurality of outputs, and wherein a second input of said plurality of inputs corresponds to a second output of said plurality of outputs;
a first plurality of multiplexers coupled to said plurality of inputs and said plurality of outputs; and a select line coupled to said first plurality of multiplexers and operable to change a respective state associated with each multiplexer of said first plurality of multiplexers, and wherein said processor is operable to configure said first plurality of multiplexers to perform, responsive to accessing at least one signal using said select line, at least one operation on a plurality of signals accessed using said plurality of inputs, wherein said plurality of signals is output by said plurality of logic elements, and wherein performance of said at least one operation is operable to expand functionality of said plurality of logic elements; and wherein said first and second inputs are adjacent inputs, wherein said at least one operation comprises communicating a first signal of said plurality of signals from said first input to said second output using a first multiplexer of said first plurality of multiplexers, and wherein said at least one operation further comprises communicating a second signal of said plurality of signals from said second input to said second output using said first multiplexer.

15. The integrated circuit of claim 14, wherein said at least one operation comprises communicating a first signal from said first input to said first output using a first multiplexer of said first plurality of multiplexers, and wherein said at least one operation further comprises communicating a second signal from said second input to said second output using a second multiplexer of said first plurality of multiplexers.

16. The integrated circuit of claim 14, wherein said at least one operation comprises communicating a first signal from said first input to said second output using a first multiplexer of said first plurality of multiplexers, and wherein said at least one operation further comprises communicating a second signal from said second input to a third output of said plurality of outputs using a second multiplexer of said first plurality of multiplexers.

17. The integrated circuit of claim 16, wherein said second signal is communicated to a third input of said plurality of inputs, and wherein said at least one operation further comprises communicating said second signal from said third input to a fourth output of said plurality of outputs using a third multiplexer of said first plurality of multiplexers.

18. The integrated circuit of claim 14, wherein said circuit further comprises:

a second plurality of multiplexers coupled to at least one select line other than said select line coupled to said first plurality of multiplexers, wherein said second plurality of multiplexers is operable to communicate, responsive to configuration using said at least one select line, a second plurality of signals from said plurality of inputs to said plurality of outputs by bypassing said first plurality of multiplexers.

19. The integrated circuit of claim 14, wherein a first multiplexer of said first plurality of multiplexers is operable to access a first signal of said plurality of signals using said first input, wherein said operation comprises a logical operation on said first signal and said at least one signal, and wherein said first multiplexer is further operable to output on said first output a second signal associated with a result of said logical operation.

* * * * *